(12) United States Patent
Wu et al.

(10) Patent No.: US 11,854,988 B2
(45) Date of Patent: Dec. 26, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW); Chung-Shi Liu, Hsinchu (TW); Chien-Hsun Lee, Chu-tung Town (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 286 days.

(21) Appl. No.: 17/107,181

(22) Filed: Nov. 30, 2020

(65) Prior Publication Data

US 2021/0082827 A1 Mar. 18, 2021

Related U.S. Application Data

(62) Division of application No. 16/185,861, filed on Nov. 9, 2018, now Pat. No. 10,854,552.

(Continued)

(51) Int. Cl.
*H01L 23/02* (2006.01)
*H01L 23/538* (2006.01)
(Continued)

(52) U.S. Cl.
CPC ........ *H01L 23/5389* (2013.01); *H01L 21/565* (2013.01); *H01L 23/3114* (2013.01); *H01L 23/3128* (2013.01); *H01L 23/5383* (2013.01); *H01L 24/09* (2013.01); *H01L 24/17* (2013.01); *H01L 24/32* (2013.01); *H01L 24/73* (2013.01);
(Continued)

(58) Field of Classification Search
CPC ............. H01L 23/5389; H01L 23/3114; H01L 23/3128; H01L 24/09; H01L 24/17; H01L 24/32; H01L 2224/0231; H01L 2224/02373; H01L 24/16; H01L 24/81; H01L 24/83; H01L 2224/12105;
(Continued)

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

KR 20130015885 A 2/2013
KR 20140001085 A 1/2014

*Primary Examiner* — Theresa T Doan
(74) *Attorney, Agent, or Firm* — Slater Matsil, LLP

(57) ABSTRACT

A method of forming a semiconductor device includes arranging a semi-finished substrate, which has been tested and is known to be good, on a carrier substrate. Encapsulating the semi-finished substrate in a first encapsulant and arranging at least one semiconductor die over the semi-finished substrate. Electrically coupling at least one semiconductor component of the at least one semiconductor die to the semi-finished substrate and encasing the at least one semiconductor die and portions of the first encapsulant in a second encapsulant. Removing the carrier substrate from the semi-finished substrate and bonding a plurality of external contacts to the semi-finished substrate.

20 Claims, 21 Drawing Sheets

Related U.S. Application Data

(60) Provisional application No. 62/692,166, filed on Jun. 29, 2018.

(51) Int. Cl.
  *H01L 23/31* (2006.01)
  *H01L 25/18* (2023.01)
  *H01L 21/56* (2006.01)
  *H01L 23/00* (2006.01)

(52) U.S. Cl.
  CPC ...... *H01L 25/18* (2013.01); *H01L 2224/0231* (2013.01); *H01L 2224/02373* (2013.01); *H01L 2224/02379* (2013.01)

(58) Field of Classification Search
  CPC . H01L 2224/16227; H01L 2224/73204; H01L 21/56; H01L 2224/81192
  USPC ........................................................ 257/678
  See application file for complete search history.

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2013/0032947 A1 | 2/2013 | Park et al. | |
| 2014/0077381 A1 | 3/2014 | Lin et al. | |
| 2016/0300813 A1 | 10/2016 | Zhai et al. | |
| 2016/0300817 A1* | 10/2016 | Do | H01L 25/03 |
| 2016/0315071 A1* | 10/2016 | Zhai | H01L 24/73 |
| 2017/0005073 A1 | 1/2017 | Lin et al. | |

* cited by examiner

SEMICONDUCTOR DEVICE AND METHOD OF MANUFACTURE

PRIORITY CLAIM AND CROSS-REFERENCE

This application is a divisional of U.S. patent application Ser. No. 16/185,861, entitled "Semiconductor Device and Method of Manufacture," filed on Nov. 9, 2018, which claims priority to and the benefit of U.S. Provisional Application No. 62/692,166, filed on Jun. 29, 2018, entitled "Semiconductor Device and Method of Manufacture," which application is hereby incorporated herein by reference in its entirety.

BACKGROUND

Generally, a semiconductor die may be connected to other devices external to the semiconductor die through a type of packaging utilizing solder bumps. The solder bumps may be formed by initially forming a layer of under-bump metallization in contact with a conductive portion of the semiconductor die and then placing solder onto the under-bump metallization. After the solder has been placed, a reflow operation may be performed in order to shape the solder into the desired bump shape. The solder bump may then be placed into physical contact with the external device and another reflow operation may be performed in order to bond the solder bump with the external device. In such a fashion, a physical and electrical connection may be made between the semiconductor die and an external device, such as a printed circuit board, another semiconductor die, or the like.

However, the material that comprises the under-bump metallization is merely one more type of material placed onto a stack of many different materials, such as dielectric materials, metallization materials, etch stop materials, barrier layer materials, and other materials utilized in the formation of the semiconductor die. Each one of these different materials may have a unique coefficient of thermal expansion that is different from the other materials. This type of coefficient of thermal expansion mismatch causes each one of the materials to expand a different distance when the semiconductor die is heated during later processing, testing or use. As such, at elevated temperatures there is a coefficient of thermal expansion mismatch that causes stresses to form between the different materials and, hence, the different parts of the semiconductor die. If not controlled, these stresses can cause delamination between the various layers of material, especially when the materials used include copper and a low-k dielectric layer. This delamination can damage or even destroy the semiconductor die during the manufacturing process or else during its intended use.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
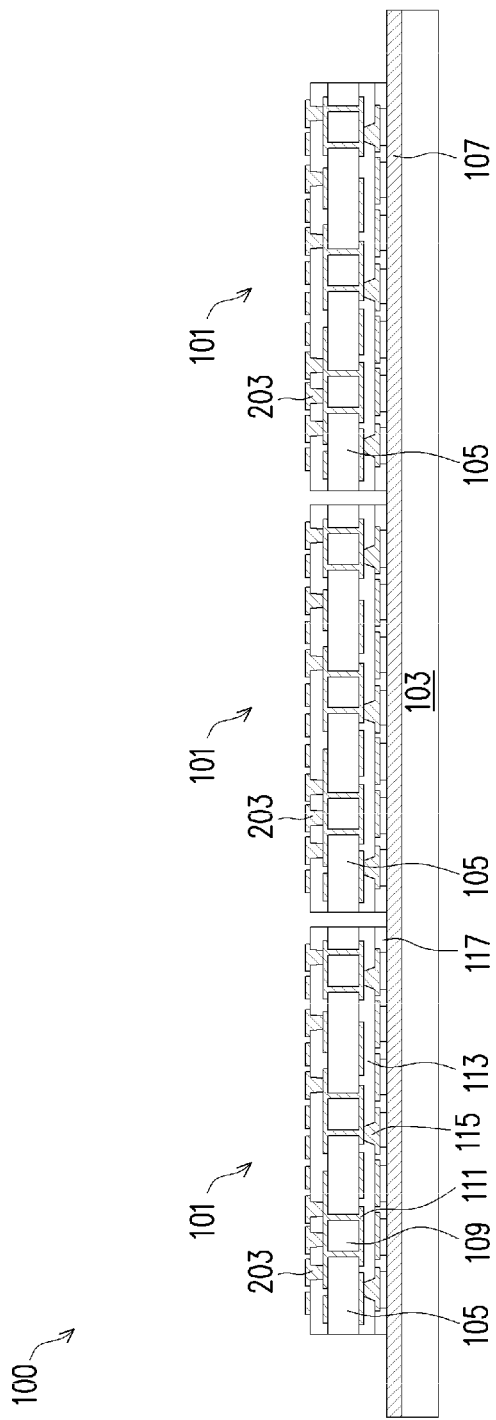
FIG. 1 illustrates attaching a plurality of substrates to a carrier, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown an intermediate structure 100 of an intermediate step in forming a reconstructed wafer (e.g., a reconstituted wafer). The intermediate structure 100 comprises a plurality of interconnect structures 101 (e.g., semi-finished substrates) bonded to an upper surface of a carrier substrate 103 using, for example, an adhesive film 107. As such, each of the plurality of interconnect structures 101 may be tested and may be known to be good prior to being bonded to the carrier substrate 103. The carrier substrate 103 may be attached to one side of the plurality of interconnect structures 101 while processing the opposing side of the interconnect structures 101 to provide temporary mechanical and structural support during processing and to reduce or prevent damage to the plurality of interconnect structures 101.

In an embodiment, the plurality of interconnect structures 101 are initially fabricated (e.g., as a plurality of semi-finished substrates) within a substrate wafer (not shown) and are formed such that each of the plurality of interconnect structures 101 includes a substrate 105 having one or more through-substrate vias (TSVs) 109 extending through the interconnect substrate 105. According to some embodiments, the one or more interconnect structures 101 includes a plurality of dielectric layers that are formed over a first side of the interconnect substrate 105 with a plurality of metallization layers that are formed in the plurality of dielectric layers. The dielectric layers may be any suitable dielectric material. In an embodiment, one or more of the dielectric layers are formed of a material having a low dielectric constant value (LK value), e.g., a k value less than about 3.5, such as CVD Black Diamond-I, SOD SILK, or the like. In another embodiment, one or more of the dielectric layers are formed of a material having an extremely low dielectric constant (ELK value), e.g., a k value less than about 2.5, such as CVD Black Diamond-II.

According to an embodiment, the interconnect substrate 105 may be, for example, a silicon or glass interposer, an organic substrate, a ceramic substrate, a high-density interconnect, or the like. In some embodiments, the interconnect substrate 105 may include electrical elements, such as capacitors, resistors, signal distribution circuitry, and/or the like. These electrical elements may be active, passive, or a combination of active and passive elements. In other embodiments, the interconnect substrate 105 may be free of electrical elements, including passive elements such as capacitors, resistors, inductors, varactors, or the like.

The metallization layers and the vias of the one or more interconnect structures 101 may be formed of any suitable conductive material using any suitable process. For example, in an embodiment a damascene process is utilized in which the respective dielectric layer is patterned and etched utilizing photolithography techniques to form trenches corresponding to the desired pattern of metallization layers and/or vias. An optional diffusion barrier and/or optional adhesion layer may be deposited and the trenches may be filled with a conductive material. Suitable materials for the barrier layer includes titanium, titanium nitride, tantalum, tantalum nitride, or other alternatives, and suitable materials for the conductive material include copper, silver, gold, tungsten, aluminum, combinations thereof, or the like. In an embodiment, the metallization layers may be formed by depositing a seed layer of copper or a copper alloy, and filling the trenches by electroplating. A chemical mechanical planarization (CMP) may be used to remove excess conductive material from a surface of the respective dielectric layer and to planarize the surface for subsequent processing.

The one or more through-substrate vias (TSVs) 109 provides an electrical connection between an electrical element and an external connection formed on opposing sides of the interconnect substrate 105. The one or more TSVs 109 may be formed by any suitable technique and of any suitable material(s). For example, the one or more TSVs 109 may be formed by etching a via partially through the interconnect substrate 105 and depositing a conductive material therein, after which the backside of the interconnect substrate 105 may be thinned to expose the one or more TSVs 109 on the backside of the interconnect substrate 105. In another technique, the one or more TSVs 109 may be formed by etching a via partially through the interconnect substrate 105 and depositing a dielectric layer in the via. In this embodiment, the dielectric layer within the via is removed after the backside of the interconnect substrate 105 is thinned to expose the dielectric layer within the via, and a conductive material is re-deposited within the via to complete the formation of the one or more TSVs 109.

The one or more through-substrate vias 109 may be filled with a conductive material such as Al, Cu, other metals, alloys, doped polysilicon, combinations thereof, and the like. Furthermore, the one or more TSVs 109 may have one or more liners, such as a barrier layer, adhesion layer, or the like, formed of a dielectric material, conductive material, or a combination thereof.

The thinning process may be performed using an etching process and/or a planarization process, such as a CMP process. For example, initially a planarizing process, such as a CMP, may be performed to initially expose the liner of the one or more TSVs 109. Thereafter, one or more wet etching processes having a high etch-rate selectivity between the material of the liner and the interconnect substrate 105 may be performed, thereby leaving the one or more TSVs 109 protruding from the backside of the interconnect substrate 105. In embodiments in which the interconnect substrate 105 comprises silicon, the etch process may be, for example, a dry etch process using $HBr/O_2$, $HBr/Cl_2/O_2$, $SF_6/CL_2$, $SF_6$ plasma, or the like.

The one or more interconnect structures 101 may further comprise a first redistribution layer 111 and a first protective layer 113. The first redistribution layer 111 may be formed of any suitable conductive material, such as copper, copper alloys, aluminum, silver, gold, combinations thereof, and/or the like, formed by any suitable technique, such as electrochemical plating (ECP), electroless plating, other deposition methods such as sputtering, printing, and chemical vapor deposition (CVD) methods, or the like. A mask (not shown) may also be used.

The first protective layer 113 may be blanket formed and patterned to form openings, in which redistribution layer conductive structures 115 are formed. The first protective layer 113 may be formed of nitrides, oxides, polyimide, low-temp polyimide, solder resist, and/or the like. The openings in the first protective layer 113 may be formed using photo-lithography techniques such that the openings expose portions of the first redistribution layer 111. The redistribution layer conductive structures 115 are formed of one or more layers of conductive materials and provide an electrical connection between the first redistribution layer 111 and overlying structures to be formed on the redistribution layer conductive structures 115 in subsequent processing steps. The redistribution layer conductive structures 115 may be formed, for example, of one or more layers of copper, gold, titanium, titanium tungsten, nickel, combinations thereof, or the like. It should be noted that the first protective layer 113 may act as a stress buffer layer to reduce the amount of stress in the electrical connections.

A passivation layer 117 may be polymide formed over the first protective layer 113 and over the redistribution layer conductive structures 115. Once formed, the passivation layer 117 may be patterned to expose portions of the redistribution layer conductive structures 115.

Layers similar to the first redistribution layer 111, the first protective layer 113, and the redistribution layer conductive structures 115 may be formed over the interconnect substrate 105 of the one or more interconnect structures 101, using similar processes and materials as discussed above to provide an electrical connection to contacts in the uppermost metallization layer (not shown). Once formed, redistribution layer conductive structures 115 formed over the interconnect substrate 105 may be electrically connected to redistribution layer conductive structures 115 formed on an opposing side of the interconnect substrate 105 via the first redistribution layer 111 and one or more TSVs 109 of the interconnect structures 101.

In addition, external connectors 203 (e.g., contact pads) may be formed over the redistribution layer conductive structures 115 formed over the interconnect substrate 105 of the one or more interconnect structures 101. The external connectors 203 (e.g., contact pads) are formed to provide an electrical connection to a subsequently placed semiconductor die 301 (not illustrated in FIG. 1 but illustrated and described below with respect to FIG. 3), according to an embodiment. In other embodiments, the external connectors 203 are formed to provide an electrical connection to a subsequently formed first universal redistribution layer (URDL) 1105 (not illustrated in FIG. 1 but illustrated and described below with respect to FIG. 11). In an embodiment the external connectors 203 are formed of a conductive material such as aluminum, although other suitable materials, such as copper, tungsten, or the like, may be utilized. The external connectors 203 may be formed using a process such as CVD or PVD, although other suitable materials and methods may be utilized. Once the material for the external connectors 203 has been deposited, the material may be shaped into the external connectors 203 using, e.g., a photolithographic masking and etching process.

In some embodiments, the structuring of the first redistribution layer 111, the first protective layer 113, the redistribution layer conductive structures 115, and the external connectors 203 of the one or more interconnect structures 101 formed over the interconnect substrate 105 may reduce the amount of stress imparted to the interconnect structures 101 during formation. For example, stresses attributed to CTE mismatch between material of the TSVs 109 and materials of the interconnect substrate 105 may be reduced as the materials of the interconnect structures 101 experience temperature cycles. The reduced stress levels may reduce and/or prevent issues such as through-substrate via popping which, in turn, may prevent electrical open/short failure conditions and/or prevent delamination of one or more of the dielectric layers.

Once fabricated, the plurality of interconnect structures 101 are tested to identify individual ones of the plurality of interconnect structures 101 that are working before being placed on the carrier substrate 103, so that only known good interconnect structures 101 may be used, thereby reducing defects during production of semiconductor devices. For example, each of the plurality of interconnect structures 101 fabricated within the substrate wafer may be tested by a probe card (also not shown). However, one having ordinary skill in the art will appreciate that a wide variety of device testing methods exist, and any suitable device testing process may be used. All such processes are fully intended to be included within the scope of the embodiments.

Once tested, individual ones of the plurality of interconnect structures 101 are singulated from the substrate wafer. Once singulated, a plurality of individual working interconnect structures 101 are arranged, for example, by a pick and place machine, on the carrier substrate 103 as a plurality of interconnect structures 101 as shown in FIG. 1. However, any other method of arranging the plurality of interconnect structures 101 on the carrier substrate 103 may also be used.

The carrier substrate 103 comprises, for example, silicon based materials, such as glass or silicon oxide, or other materials, such as aluminum oxide, combinations of any of these materials, or the like. The carrier substrate 103 may be planar in order to accommodate bonding of the plurality of interconnect structures 101. However, any suitable materials and any desired elevation of the carrier substrate 103 may be used to accommodate bonding of the plurality of interconnect structures 101.

As further illustrated in FIG. 1, the adhesive film 107 is disposed between and bonds the plurality of interconnect structures 101 to the carrier substrate 103. In an embodiment, the adhesive film 107 may comprise an ultra-violet glue which loses its adhesive properties when exposed to ultra-violet light. However, other types of adhesives, such as pressure sensitive adhesives, radiation curable adhesives, epoxies, combinations of these, or the like, may also be used. In an embodiment, the adhesive film 107 may be placed onto the carrier substrate 103 in a semi-liquid or gel form, which is readily deformable under pressure.

Although the adhesive film 107 is described, herein with regard to some embodiments, as a gel, a film, or a tape, it is to be understood that any suitable bonding materials may be used to bond the interconnect structures 101 to the carrier substrate 103 without departing from the spirit and scope of the present disclosure. In addition, all appropriate processes for bonding the plurality of interconnect structures 101 to the carrier substrate 103 are fully intended to be included within the scope of the embodiments.

Figure 2:
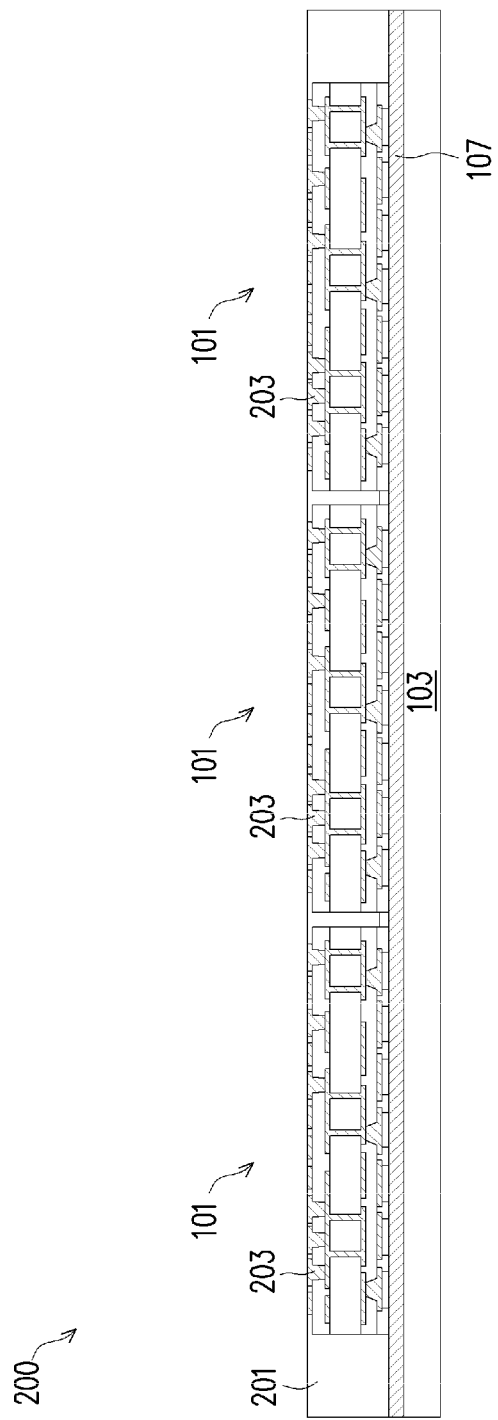
FIG. 2 illustrates molding and thinning the plurality of substrates attached to the carrier into a first package, in accordance with some embodiments.

Turning to FIG. 2, this figure illustrates a molding and thinning process for forming the plurality of interconnect structures 101 attached to the carrier substrate 103 into a reconstructed wafer 200 in accordance with some embodiments. An encapsulation of the plurality of interconnect structures 101 may be performed in a molding device (not individually illustrated in FIG. 2), which may comprise a top molding portion and a bottom molding portion separable from the top molding portion. When the top molding portion is lowered to be adjacent to the bottom molding portion, a molding cavity may be formed for the carrier substrate 103, the adhesive film 107, and the plurality of interconnect structures 101.

However, while the forming of the reconstructed wafer 200 is described above using the intermediate structure 100 and is presented as one illustrative embodiment, it is not intended to be limiting to the embodiments. Any other suitable wafer on carrier 103 structure (e.g., an un-singulated wafer) may be used to form the reconstructed wafer 200 and all such wafers are fully intended to be included within the scope of the embodiments.

During the encapsulation process the top molding portion may be placed adjacent to the bottom molding portion, thereby enclosing the carrier substrate 103, the adhesive film 107, and the plurality of interconnect structures 101 within the molding cavity. Once enclosed, the top molding portion and the bottom molding portion may form an airtight seal in order to control the influx and outflux of gasses from the molding cavity. Once sealed, a first encapsulant 201 may be placed within the molding cavity. The first encapsulant 201 may be a molding compound resin such as polyimide, PPS, PEEK, PES, a heat resistant crystal resin, combinations of these, or the like. The first encapsulant 201 may be placed within the molding cavity prior to the alignment of the top molding portion and the bottom molding portion, or else may be injected into the molding cavity through an injection port.

Once the first encapsulant 201 has been placed into the molding cavity such that the first encapsulant 201 encapsulates the carrier substrate 103, the adhesive film 107, and the plurality of interconnect structures 101, the first encapsulant 201 may be cured in order to harden the first encapsulant 201 for optimum protection. While the exact curing process is dependent at least in part on the particular material chosen for the first encapsulant 201, in an embodiment in which molding compound is chosen as the first encapsulant 201, the curing could occur through a process such as heating the first encapsulant 201 to between about 100° C. and about 130° C., such as about 125° C. for about 60 sec to about 3000 sec, such as about 600 sec. Additionally, initiators and/or catalysts may be included within the first encapsulant 201 to better control the curing process.

However, as one having ordinary skill in the art will recognize, the curing process described above is merely an exemplary process and is not meant to limit the current embodiments. Other curing processes, such as irradiation or even allowing the first encapsulant 201 to harden at ambient temperature, may be used. Any suitable curing process may be used, and all such processes are fully intended to be included within the scope of the embodiments discussed herein.

FIG. 2 also illustrates a thinning of the first encapsulant 201 in order to provide a planar surface of the reconstructed wafer 200 opposite the carrier substrate 103 and in order to expose the external connectors 203 of the plurality of interconnect structures 101 in the planar surface, for further processing. The thinning may be performed, e.g., using a mechanical grinding or chemical mechanical polishing (CMP) process whereby chemical etchants and abrasives are utilized to react and grind away the first encapsulant 201 until the external connectors 203 of the plurality of interconnect structures 101 have been exposed. As such, the plurality of interconnect structures 101 may have a planar surface that is also planar with the first encapsulant 201.

However, while the CMP process described above is presented as one illustrative embodiment, it is not intended to be limiting to the embodiments. Any other suitable removal process may be used to thin the first encapsulant 201 of the reconstructed wafer 200 and to expose the external connectors 203 in the planar surface of the reconstructed wafer 200. For example, a series of chemical etches may be utilized. This process and any other suitable process may alternatively be utilized to thin the first encapsulant 201 and all such processes are fully intended to be included within the scope of the embodiments.

Figure 3:
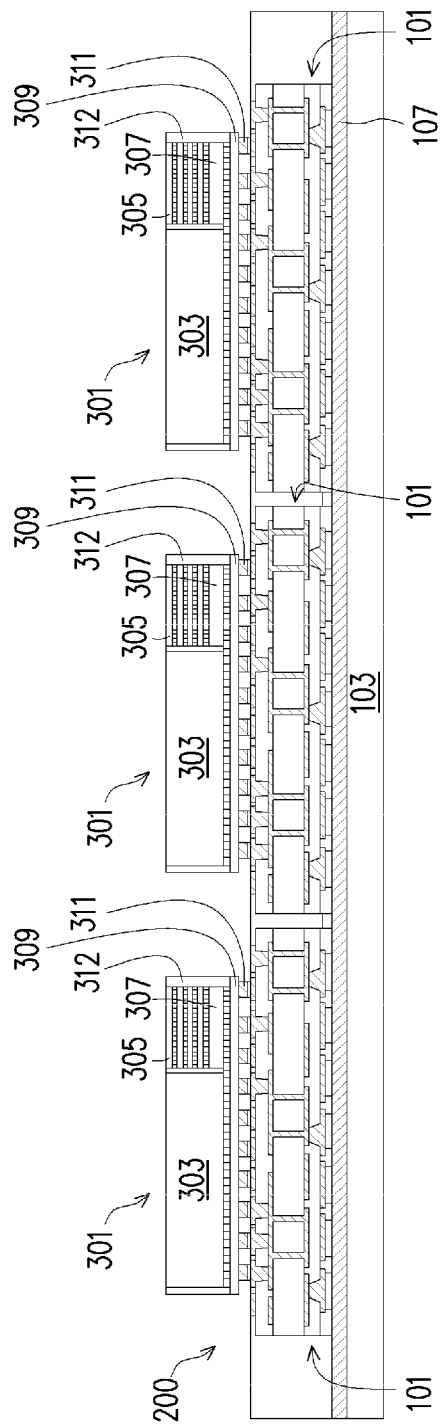
FIG. 3 illustrates bonding a plurality of integrated fan-out (InFO) components to the plurality of substrates of the first package, in accordance with some embodiments.

Turning to FIG. 3, this figure illustrates a plurality of packaged semiconductor devices 301 that have been tested, found to be working, and arranged on the reconstructed wafer 200, according to an embodiment. The plurality of packaged semiconductor devices 301 may be arranged, for example, by a pick and place machine (not shown), over respective ones of the plurality of interconnect structures 101 of the reconstructed wafer 200, according to an embodiment. However, any other alternative method of arranging the plurality of packaged semiconductor devices 301 on the reconstructed wafer 200 may be used.

In an embodiment, the packaged semiconductor device 301 may include a processor die 303 (e.g., xPU), such as, a central processing unit (CPU), a micro control unit (MCU), a graphics processing unit (GPU), an application processor (AP), or the like. The packaged semiconductor device 301 may also include a memory cube 305 (e.g., hybrid memory cube (HMC)), such as, a stack of through-silicon via (TSV) connected dynamic random access memory (DRAM) dies (e.g., 3D stacked DRAM) combined with a memory controller die 307 (e.g., HMC controller die or logic die), or the like. The processor die 303, the memory cube 305, and the memory controller die 307 may be linked together via a combination of HMC links, TSVs and microbumps and may be embedded in encapsulation material 312. External contacts of the packaged semiconductor device 301 may be disposed on a first surface of the semiconductor package 301 opposite the thinned backside second surface of the semiconductor package 301.

Furthermore, the packaged semiconductor device 301 may include an integrated fan out (InFO) layer 309 with external contacts 311. The InFO layer 309 may include a plurality of dielectric layers and redistribution layers (RDLs) for interconnecting the external contacts of the packaged semiconductor device 301 arranged on a first side of the InFO layer 309 to the external contacts 311 of a second side of the InFO layer 309 opposite the first side of the InFO layer 309.

In an embodiment, the external contacts 311 may be, e.g., a conductive pillar such as a copper pillar or copper post. However, the embodiments are not limited to these, and may also be solder bumps, copper bumps, or other suitable external contacts 311 that may be made to provide electrical connection from the packaged semiconductor device 301 to other external devices, for example, via the interconnect structure 101. All such external contacts are fully intended to be included within the scope of the embodiments.

In an embodiment in which the external contacts 311 are copper pillars, the external contacts 311 may be formed by initially forming a seed layer (not individually illustrated in FIG. 3). The seed layer is a thin layer of a conductive material that aids in the formation of a thicker layer during subsequent processing steps, and may comprise a layer of titanium about 500 Å thick followed by a layer of copper about 3,000 Å thick. The seed layer may be created using processes, such as sputtering, evaporation, or PECVD processes, depending upon the desired materials to a thickness of between about 0.1 μm and about 1 μm, such as about 0.3 μm.

The external contacts 311 comprise one or more conductive materials, such as copper, tungsten, other conductive metals, or the like, and may be formed, for example, by electroplating, electroless plating, or the like. In an embodiment, a photolithographic and electroplating process is used wherein the packaged semiconductor device 301 is submerged or immersed in an electroplating solution. The packaged semiconductor device 301 surface is electrically connected to the negative side of an external DC power supply such that the packaged semiconductor device 301 functions as the cathode in the electroplating process. A solid conductive anode, such as a copper anode, is also immersed in the solution and is attached to the positive side of the power supply. The atoms from the anode are dissolved into the solution, from which the cathode, e.g., the packaged semiconductor device 301, acquires the dissolved atoms, thereby plating the exposed conductive areas of the packaged semiconductor device 301, e.g., the exposed portions of the seed layer within the openings.

As shown in FIG. 3, in an embodiment, the plurality of packaged semiconductor devices 301 may be arranged on the reconstructed wafer 200 such that the external contacts 311 of the plurality of packaged semiconductor devices 301 are aligned and placed in contact with the external contacts 203 of respective ones of the plurality of interconnect structures 101. Once arranged, a bonding procedure may be performed to bond the plurality of packaged semiconductor devices 301 to the plurality of interconnect structures 101.

In some embodiments, the external contacts 311 may be bonded to the external contacts 203 via direct copper-to-copper (Cu-to-Cu) bonding. In one embodiment, the Cu-to-Cu bonding between external contacts 311 and the external contacts 203 may be achieved at temperatures between 150-250° C. using a compressive stress of 100 psi (0.69 MPa) and being held for a period of between 10-60 minutes at 10-3 torr. The temperatures used during the Cu-to-Cu bonding may be lower relative to other bonding methods (e.g., solder reflow). In addition, the interconnect structures 101 and/or the first encapsulant 201 of the reconstructed wafer 200 may be formed to have an equivalent coefficient of thermal expansion (CTE) (e.g., about 10 ppm) that is similar to the CTE of the packaged semiconductor devices 301 (e.g., about 7-8 ppm). As such, a multi-chip module (MCM) (e.g., a Multi-die InFO package, a large package component, or a super large package component (e.g., a component having a package size >70 mm by 70 mm)) may be formed to comprise the reconstructed wafer 200 at the relatively lower temperatures achieved by Cu-to-Cu bonding. Furthermore, the multi-chip module may be formed with an equivalent coefficient of thermal expansion (CTE) that is close to or approximate that of a printed circuit board (PCB) which minimizes stress between materials during processing, bonding and encapsulating. For example, due to elevated temperatures during bonding of components, material strains and stresses may be experienced by components having dissimilar CTEs, causing cracks and delamination to form in the components and/or PCB. However, due to the relatively lower temperatures associated with Cu-to-Cu bonding and/or due to the minimal material stresses imparted to the multi-chip module formed with CTEs that are similar or approximate the CTEs of the PCB, an increase in the board level reliability will be achieved.

In other embodiments, the external contacts 311 may be bonded to the external contacts 203 via solder bonding. In an embodiment, the solder bonding using for example, the external contacts 311 may include contact bumps such as microbumps or controlled collapse chip connection (C4) bumps and may comprise a material such as tin, or other suitable materials, such as silver or copper. In an embodiment in which the external contacts 311 include tin solder bumps (not specifically shown), the tin solder bumps may be formed by initially forming a layer of tin through any suitable method such as evaporation, electroplating, printing, solder transfer, ball placement, etc., to a thickness of, e.g., about 100 µm. Once a layer of tin has been formed on the external contacts 311, a reflow is performed in order to shape the material into the desired bump shape.

Once the tin solder bumps have been formed, the external contacts 311 of the packaged semiconductor devices 301 are aligned with and placed into physical contact with corresponding ones of the external contacts 203 of respective ones of the plurality of interconnect structures 101. After being arranged in physical contact with one another, a solder bonding procedure is performed to bond the packaged semiconductor devices 301 to the respective ones of the plurality of interconnect structures 101. For example, in an embodiment in which the external contacts 311 include tin solder bumps, the bonding process may comprise a reflow process whereby the temperature of the external contacts 311 is raised to a point where the tin solder bumps will liquefy and flow, thereby bonding the external contacts 311 of the packaged semiconductor devices 301 to respective external contacts 203 of the interconnect structures 101 once the solder of the tin solder bumps re-solidifies.

Figure 4:
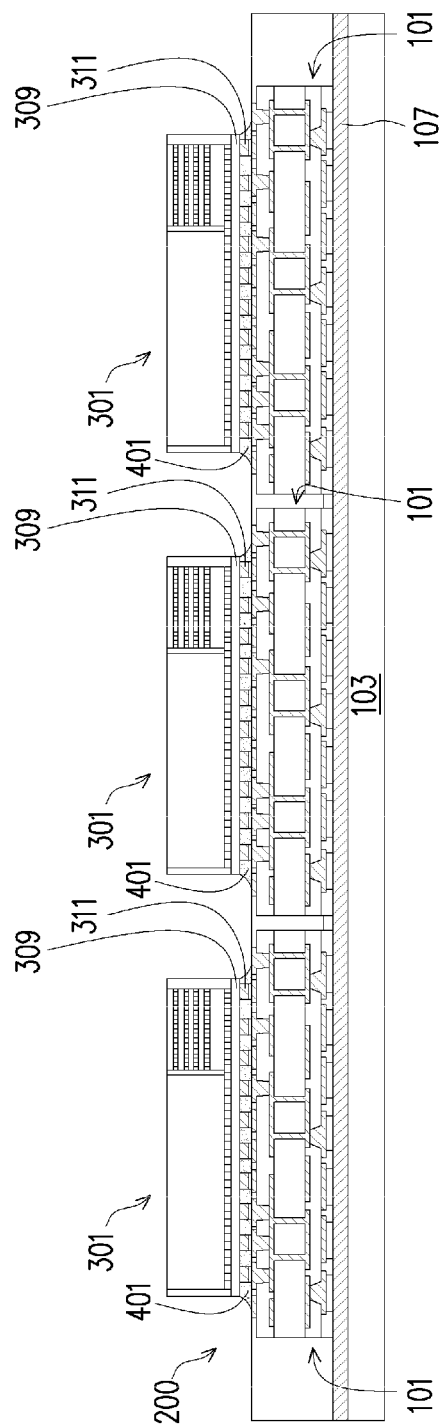
FIG. 4 illustrates providing an underfill for the plurality of InFO components of the first package, in accordance with some embodiments.

FIG. 4 illustrates an underfill process for supplying an underfill material 401 to openings between an underside of the InFO layer 309 of the packaged semiconductor devices 301 and the planar surface of the reconstructed wafer 200. In some embodiments, an underfill material 401 may be formed between the packaged semiconductor devices 301 and the planar surface of the reconstructed wafer 200, surrounding the bonded connections of the external contacts 311 and the external contacts 203 of the plurality of interconnect structures 101. The underfill material 401 may be formed by a capillary underfill (CUF) flow process after the packaged semiconductor devices 301 have been attached. In another embodiment, the underfill material 401 may be provided by a suitable deposition process prior to the packaged semiconductor devices 301 being attached.

In still other embodiments, the underfill may be provided by a Moldable Underfill (MUF) which allows for a single step to be performed in order to provide the underfill while encapsulating the packaged semiconductor devices 301 bonded to the planar surface of the reconstructed wafer 200. The underfill (MUF) may reduce stress and protect the solder bonds and/or Cu-to-Cu bonds. Although CUF and MUF processes have been described for providing an underfill for the packaged semiconductor devices 301, any suitable material and any suitable process for providing an underfill may be used without departing from the spirit and scope of the embodiments described herein.

Figure 5:
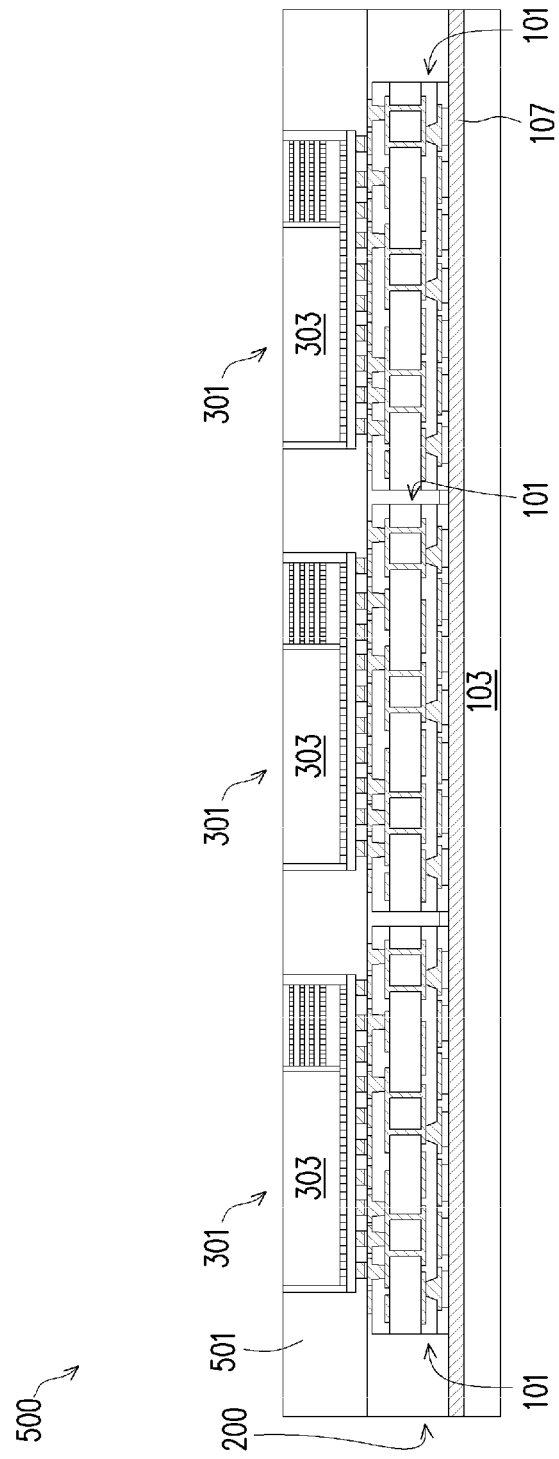
FIG. 5 illustrates encapsulating the plurality of InFO components and the plurality of substrates to form a multi-chip module (MCM) (e.g., Multi-die InFO package, a large package component, etc.), in accordance with some embodiments.

FIG. 5 illustrates an encapsulation of the packaged semiconductor devices 301 bonded to the planar surface of the reconstructed wafer 200 to form a wafer level package 500, according to some embodiments. The encapsulation may be performed in a molding device (not shown), which may comprise a top molding portion and a bottom molding portion separable from the top molding portion. When the top molding portion is lowered to be adjacent to the bottom molding portion, a molding cavity may be formed for the carrier substrate 103, the reconstructed wafer 200 and the plurality of packaged semiconductor devices 301.

During the encapsulation process the top molding portion may be placed adjacent to the bottom molding portion, thereby enclosing the carrier substrate 103, the reconstructed wafer 200 and the plurality of packaged semiconductor devices 301 within the molding cavity. Once enclosed, the top molding portion and the bottom molding portion may form an airtight seal in order to control the influx and outflux of gasses from the molding cavity. Once sealed, an encapsulant 501 may be placed within the molding cavity. The encapsulant 501 may be a molding compound resin such as polyimide, PPS, PEEK, PES, a heat resistant crystal resin, combinations of these, or the like. The encapsulant 501 may be placed within the molding cavity prior to the alignment of the top molding portion and the bottom molding portion, or else may be injected into the molding cavity through an injection port.

In an embodiment, the encapsulant 501 may also serve as a molded underfill (MUF) material for filling gaps between the plurality of the packaged semiconductor devices 301 and the planar surface of the reconstructed wafer 200. However, any suitable MUF encapsulant materials may be used.

Once the encapsulant 501 has been placed into the molding cavity such that the encapsulant 501 encapsulates the carrier substrate 103, the reconstructed wafer 200 and the plurality of packaged semiconductor devices 301, the encapsulant 501 may be cured in order to harden the encapsulant 501 for optimum protection. While the exact curing process is dependent at least in part on the particular material chosen for the encapsulant 501, in an embodiment in which molding compound is chosen as the encapsulant 501, the curing could occur through a process such as heating the encapsulant 501 to between about 100° C. and about 130° C., such as about 125° C. for about 60 sec to about 3000 sec, such as about 600 sec. Additionally, initiators and/or catalysts may be included within the encapsulant 501 to better control the curing process.

However, as one having ordinary skill in the art will recognize, the curing process described above is merely an embodiment of the curing process and is not meant to limit the other embodiments described herein. Other curing processes, such as irradiation or even allowing the encapsulant 501 to harden at ambient temperature, may also be used. Any suitable curing process may be used, and all such processes are fully intended to be included within the scope of the embodiments discussed herein.

FIG. 5 also illustrates a thinning of the encapsulant 501 in order to provide a thin package and/or in order to expose surfaces of the packaged semiconductor devices 301 for further processing. The thinning may be performed, e.g., using a mechanical grinding or chemical mechanical polishing (CMP) process whereby chemical etchants and abrasives are utilized to react and grind away the encapsulant 501 until a desired thinning of the encapsulant 501 and/or backsides of the packaged semiconductor devices 301 have been exposed for further processing. As such, the backsides of the plurality of packaged semiconductor devices 301 may have a planar surface that is also planar with the encapsulant 501.

However, while the CMP process described above is presented as one illustrative embodiment, it is not intended to be limiting to the embodiments. Any other suitable removal process may also be used to thin the encapsulant 501 and the backsides of the plurality of packaged semiconductor device 301. For example, a series of chemical etches may be utilized. This process and any other suitable process may alternatively be utilized to thin the encapsulant 501 and the plurality of packaged semiconductor devices 301 and all such processes are fully intended to be included within the scope of the embodiments.

Figure 6:
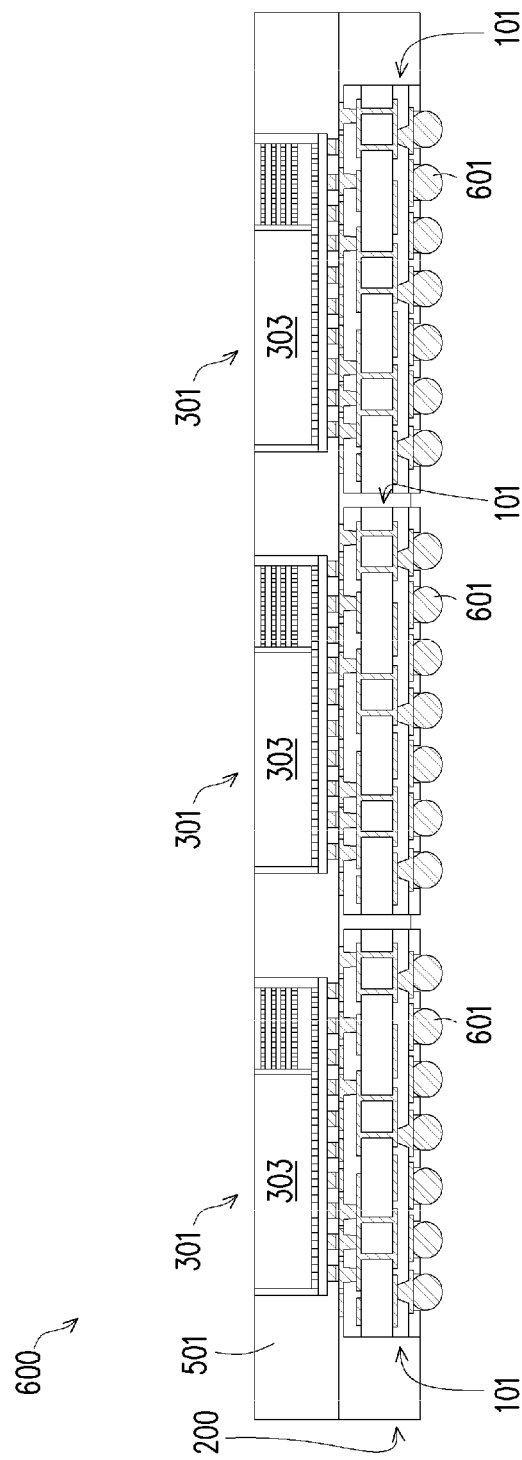
FIG. 6 illustrates removing the multi-chip module (MCM) (e.g., Multi-die InFO package) from the carrier and forming ball mounts of the multi-chip module (MCM), in accordance with some embodiments.

FIG. 6 illustrates an embodiment of a multi-die InFO package 600 after de-bonding of the carrier substrate 103 from the wafer level package 500 and forming of external contacts 601, according to some embodiments. In some embodiments, in order to de-bond the carrier substrate 103, a handling wafer (not shown) may be adhered to the planarized, thinned backside of the encapsulation material 501. In other embodiments, a wafer handling ring (not shown) and ultraviolet tape (not shown) may be used to provide support and stability for the encapsulated plurality of InFO-packaged semiconductor devices 301 during and after the de-bonding process. In an embodiment the planarized, thinned backside of the encapsulation material 501 is attached to the ring structure using, e.g., an ultraviolet tape (not shown), although any other suitable adhesive or attachment may alternatively be used.

Once the handling wafer or the ring structure and tape have been appropriately attached to the thinned, backside of the encapsulated plurality of packaged semiconductor devices 301, the carrier substrate 103 may be de-bonded from the interconnect structures 101 and surfaces of the reconstructed wafer 200 using, e.g., a thermal process to alter the adhesive properties of the adhesive film 107. For example, an energy source such as an ultraviolet (UV) laser, a carbon dioxide ($CO_2$) laser, or an infrared (IR) laser, may be used to irradiate and heat the adhesive 107 until at least some of the adhesive properties are lost. Once performed, the carrier substrate 103 and the adhesive layer 107 may be physically separated and removed from the surfaces of the reconstructed wafer 200 including the plurality of interconnect structures 101 and the first encapsulant 201.

Once de-bonded from the carrier substrate 103, a plurality of external connections 601 may be formed on exposed portions of the redistribution layer conductive structures 115 of the embedded interconnect substrate 101. These external connections 601 provide external connection points for electrically connecting the multi-die InFO package 600 to external devices. In an embodiment, the external connections 601 may be, for example, a contact bump, although any suitable connection may be utilized. In an embodiment in which the external connections 601 are contact bumps, external connections 601 may comprise a material such as tin, or other suitable materials, such as silver, lead-free tin, or copper. In an embodiment in which the external connections 601 are tin solder bumps, the external connections 601 may be formed by initially forming a layer of tin through such commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape. In some embodiments, the external connections 601 may be solder bumps/balls; in other embodiments, the external connections 601 include a conductive pillar. However, any suitable material and appropriate connection may be used to form external connections 601.

High performance computing (HPC) applications have become more popular and widely used in advanced networking and server applications, especially in view of the increased demand for artificial intelligence (AI) related applications which require high data rates, large bandwidths and low latency. However, as component package sizes get larger and larger (e.g., >100 mm by 100 mm), conventional flip chip packaging face serious chip package integration (CPI) issues relating not only to component reliability risk but also relating to board level reliability.

This multi-die InFO package component 600 and other embodiments disclosed herein can be manufactured to satisfy super large package component sizes which are required to support high performance computing (HPC) applications. For example, the multi-die InFO package component 600 can support package sizes that are greater than 70 mm by 70 mm which are required in HPC applications. Furthermore, component level and board level reliability issues are greatly reduced due to component level and board level testing during manufacturing. This testing ensures that only components (e.g., semi-finished substrate packages) that are known to be good are used during packaging which greatly increases the reliability and performance of the components and the interconnects. Meanwhile, the process for forming the multi-die InFO package component 600 being integrated in wafer form allows for a much more simplified process flow.

Figure 7:
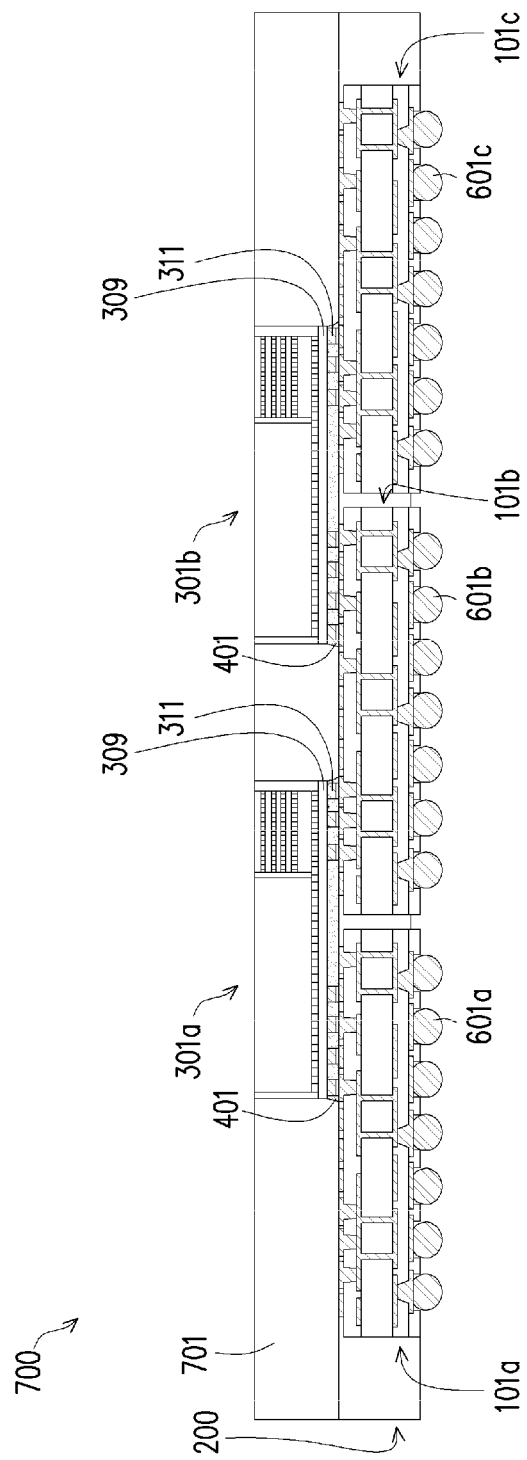
FIG. 7 illustrates a multi-chip module (MCM) including a plurality of packaged semiconductor devices arranged over and bridging adjacent interconnect structures, according to an embodiment.

FIG. 7 illustrates an embodiment of a multi-die InFO package 700 including a plurality of packaged semiconductor devices 301 arranged, for example, by a pick and place machine (not shown), over and bridging two adjacent interconnect structures 101 of the plurality of interconnect structures 101 of the reconstructed wafer 200, according to an embodiment. For example, packaged semiconductor devices 301a may bridge between adjacent interconnect structure 101a and interconnect structure 101b. In addition, packaged semiconductor devices 301b may bridge between adjacent interconnect structure 101b and interconnect structure 101c. FIG. 7 further illustrates that adjacent packaged semiconductor devices 301 may share interconnect structure 101b. For example, packaged semiconductor device 301a and packaged semiconductor device 301b share interconnect structure 101b.

In the example illustrated in FIG. 7, the packaged semiconductor device 301a includes an integrated fan out (InFO) layer 309 with external contacts 311. As shown in FIG. 7, in an embodiment, the packaged semiconductor devices 301a may be arranged on the reconstructed wafer 200 such that a first set of the external contacts 311 of the packaged semiconductor device 301a are in contact with corresponding ones of the external contacts 203 of the interconnect structure 101a and such that a second set of the external contacts 311 of the packaged semiconductor device 301a are in contact with corresponding ones of the external contacts 203 of the interconnect structure 101b. In addition, the packaged semiconductor device 301b may be arranged on the reconstructed wafer 200 such that a first set of the external contacts 311 of the packaged semiconductor device 301b are in contact with corresponding ones of the external contacts 203 of the interconnect structure 101b and such that a second set of the external contacts 311 of the packaged semiconductor device 301b are in contact with corresponding ones of the external contacts 203 of the interconnect structure 101c. Once arranged, a bonding procedure may be performed to bond the first and second sets of the external contacts 311 of the plurality of packaged semiconductor devices 301a and 301b to corresponding ones of the external contacts 203 of the interconnect structures 101, as described above.

In addition, FIG. 7 further illustrates examples of a capillary underfill (CUF) material 401 provided between the packaged semiconductor device 301a and interconnect structure 101a and interconnect structure 101b. As a further example illustrated in FIG. 7, capillary underfill (CUF) material 401 is provided between the packaged semiconductor device 301b and interconnect structure 101b and interconnect structures 101c. Also illustrated in FIG. 7 is an encapsulation material 701 that encapsulates, comes in physical contact with and conforms to exposed surfaces of the packaged semiconductor device 301a, and the packaged semiconductor device 301b. In addition, the encapsulant material 701 covers, comes in physical contact with and conforms to exposed surfaces of the interconnect structure 101a, the interconnect structure 101b, and the interconnect structure 101c, exposed surfaces of the CUF material 401 and exposed surfaces of the first encapsulant 201 of the side of the reconstructed wafer 200 that face away from the carrier substrate 103 and any exposed surfaces of the external contacts 203 of the planarized surface of the reconstructed wafer 200.

Figure 8A:
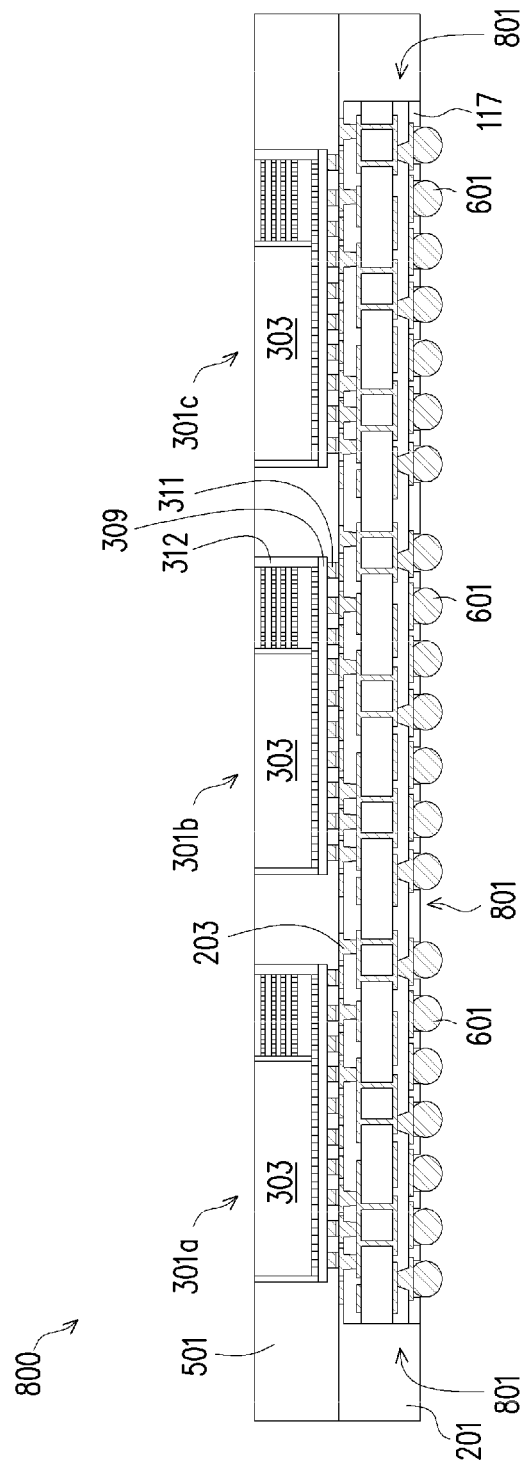
FIG. 8A illustrates a multi-chip module (MCM) including a plurality of packaged semiconductor devices arranged over and sharing a universal interconnect structure, according to an embodiment.

FIG. 8A illustrates an embodiment of a multi-die InFO package 800 including a plurality of packaged semiconductor devices 301 arranged, for example, by a pick and place machine (not shown), over a universal interconnect structure 801 of the reconstructed wafer 200, according to an embodiment. Rather than a plurality of discrete interconnect structures 101, as illustrated in FIG. 6, in this embodiment, the reconstructed wafer 200 comprises a single universal interconnect structure 801 that is embedded in the first encapsulant 201. In an embodiment, sidewalls of the universal interconnect structure 801 and sidewalls of the outermost portions of the passivation layer 117 may come in physical contact with and may be covered by the first encapsulant 201. In some embodiments, areas between the external contacts 203 of the universal interconnect structure 801 and sidewalls of the external contacts 203 may come in physical contact with and may be covered by the first encapsulant 201. In addition, the universal interconnect structure 801 is shared by the plurality of packaged semiconductor devices 301.

In the example illustrated in FIG. 8A, the packaged semiconductor devices 301 include integrated fan out (InFO) layers 309 with external contacts 311. As shown in FIG. 8A, in an embodiment, the first packaged semiconductor device 301a may be arranged on the reconstructed wafer 200 such that the external contacts 311 of the first packaged semiconductor device 301a are in contact with a first set of corresponding ones of the external contacts 203 of the universal interconnect structure 801. In addition, the second packaged semiconductor device 301b may be arranged on the reconstructed wafer 200 such that the external contacts 311 of the second packaged semiconductor device 301b are in contact with a second set of corresponding ones of the external contacts 203 of the universal interconnect structure 801. Furthermore, the third packaged semiconductor device 301c may be arranged on the reconstructed wafer 200 such that the external contacts 311 of the third packaged semiconductor device 301c are in contact with a third set of corresponding ones of the external contacts 203 of the universal interconnect structure 801. Once arranged, a bonding procedure may be performed to bond the first, second and third sets of corresponding ones of the external contacts 203 of the universal interconnect structures 801 to the respective external contacts 311 of the corresponding plurality of packaged semiconductor devices 301a, 301b and 301c, as described above.

Figure 8B:
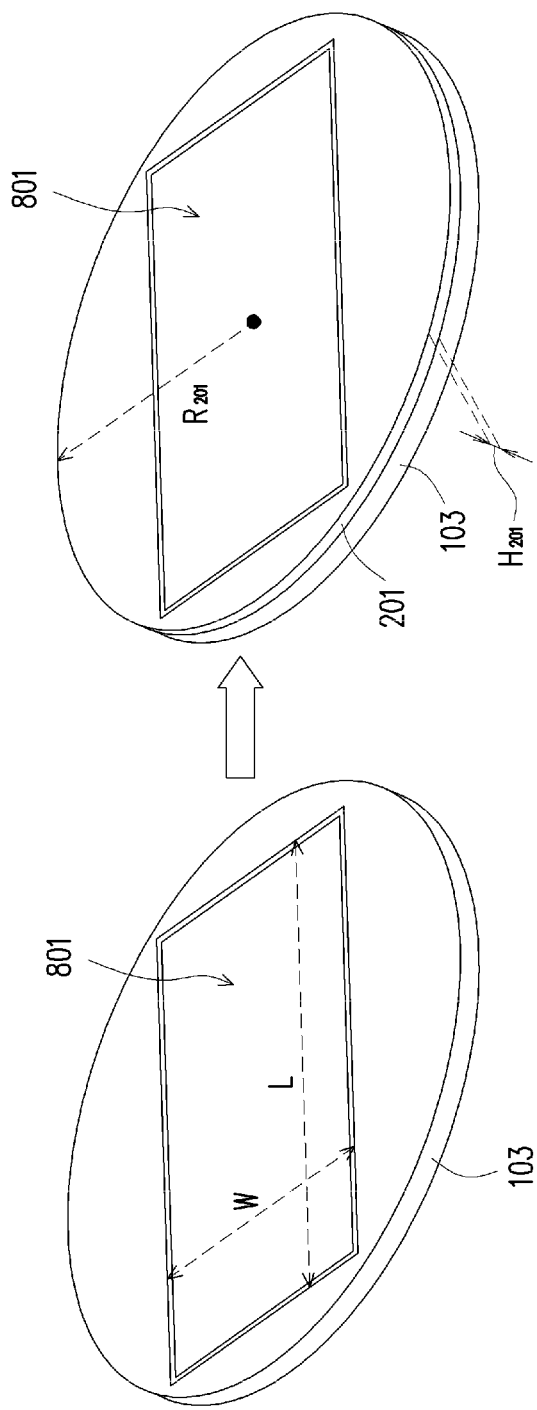
FIG. 8B and FIG. 8C illustrate processes for fabricating and encapsulating a single universal interconnect structure, according to embodiments.

With reference now to FIG. 8B, rather than a plurality of discrete interconnect structures, FIG. 8B illustrates an embodiment of a single universal interconnect structure 801 (e.g., semi-finished substrate) that is bonded to an upper surface of the carrier substrate 103. The carrier substrate 103 may be attached to one side of the interconnect structure 801 while processing the opposing side of the universal interconnect structure 801 to provide temporary mechanical and structural support during processing and to reduce or prevent damage to the interconnect structure 801. In an embodiment, the universal interconnect structure 801 may be fabricated to have an overall length L that is between about 150 mm and about 450 mm, such as about 200 mm and may have an overall width W that is between about 150 mm and about 450 mm, such as about 200 mm. However, any suitable dimensions may be used.

FIG. 8B also illustrates a molding and thinning process for forming the universal interconnect structure 801 attached to the carrier substrate 103 into the reconstructed wafer 200 (shown in FIG. 8A) in accordance with some embodiments. The encapsulation and thinning of the universal interconnect structure 801 may be performed using methods and materials used for encapsulating the plurality of interconnect structures 101 into the reconstructed wafer 200 as described above in connection with FIG. 1. However, these processes and any other suitable process may also be utilized to encapsulate the universal interconnect structure 801 and to thin the encapsulant 201 and all such processes are fully intended to be included within the scope of the embodiments. In an embodiment, the encapsulant 201 may be fabricated to have a radius $R_{201}$ that is between about 150 mm and about 230 mm, such as about 150 mm and may be thinned to an overall height $H_{201}$ that is between about 0.2 mm and about 5.0 mm, such as about 1.5 mm. However, any suitable dimensions may be used.

Figure 8C:
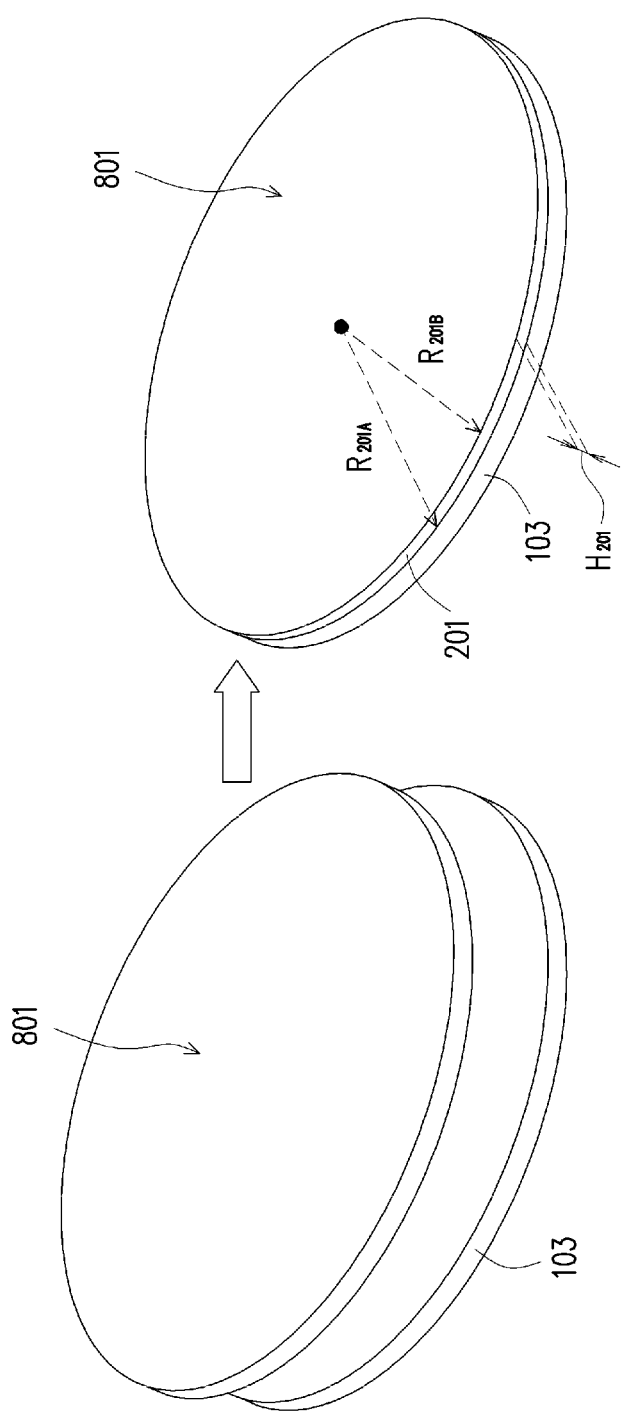

FIG. 8C illustrates another embodiment of a single universal interconnect structure 801 (e.g., semi-finished substrate) that is bonded to an upper surface of the carrier substrate 103. The carrier substrate 103 may be attached to one side of the interconnect structure 801 while processing the opposing side of the interconnect structure 801 to provide temporary mechanical and structural support during processing and to reduce or prevent damage to the interconnect structure 801. The fabrication and encapsulation of the universal interconnect structure 801 and thinning of the first encapsulant 201 may be performed using methods and materials used for fabricating, encapsulating and thinning the universal interconnect structure 801 into the reconstructed wafer 200 as described above in connection with FIG. 8B. However, these processes and any other suitable process may also be utilized to fabricate, encapsulate the universal interconnect structure 801 and to thin the first encapsulant 201 and all such processes are fully intended to be included within the scope of the embodiments.

In an embodiment, the first encapsulant 201 may be fabricated to have an outer radius $R_{201A}$ that is between about 150 mm and about 230 mm, such as about 150 mm and the first encapsulant 201 may have an inner radius $R_{201B}$ that is between about 149 mm and about 229 mm, such as about 149 mm. In an embodiment, the first encapsulant 201 may be thinned to an overall height $H_{201}$ that is between about 0.2 mm and about 5.0 mm, such as about 1.5 mm. However, any suitable dimensions may be used.

Figure 9:
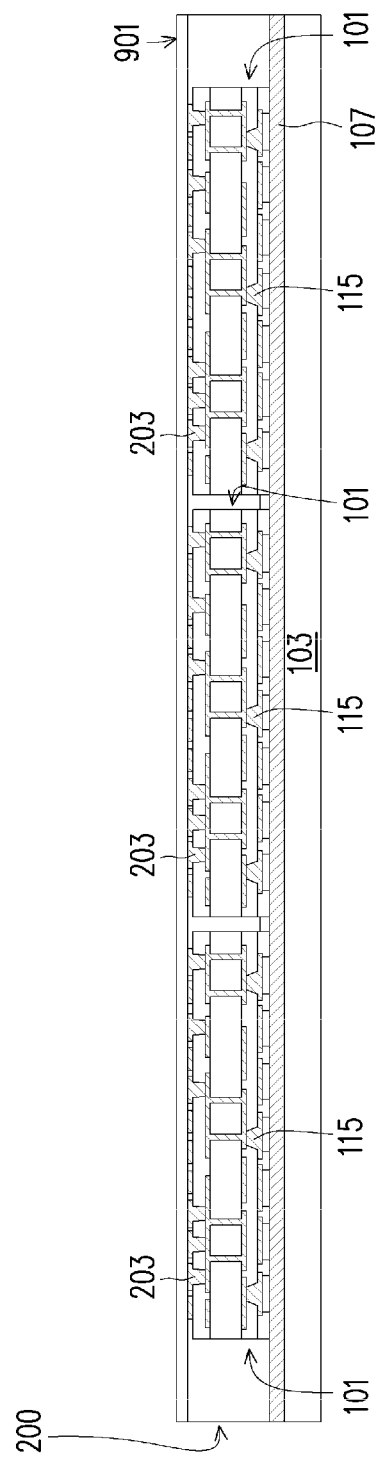
FIGS. 9-18 illustrate intermediate steps of forming a multi-chip module (MCM) (e.g., Multi-die InFO package, a large package component, etc.) including the single universal interconnect structure, according to some embodiments.

FIG. 9 illustrates formation of a first dielectric layer 901 in an intermediate step of forming a universal integrated fan out (InFO) component, according to an embodiment. In an embodiment, the first dielectric layer 901 may be a polyimide (PI) coating to protect the planar surface of the reconstructed wafer 200. The first dielectric layer 901 may be formed by coating the planar surface of the reconstructed wafer 200 with an insulating material, such as polyimide, polybenzoxazole (PBO), or epoxy, to a thickness of between about 2.5 µm and about 12 µm, such as about 4 µm. Also, the first dielectric layer 901 may be formed through either spraying a polyimide solution or by immersing the planar surface of the reconstructed wafer 200 into a polyimide solution. Any suitable method of formation may be utilized.

Figure 10:
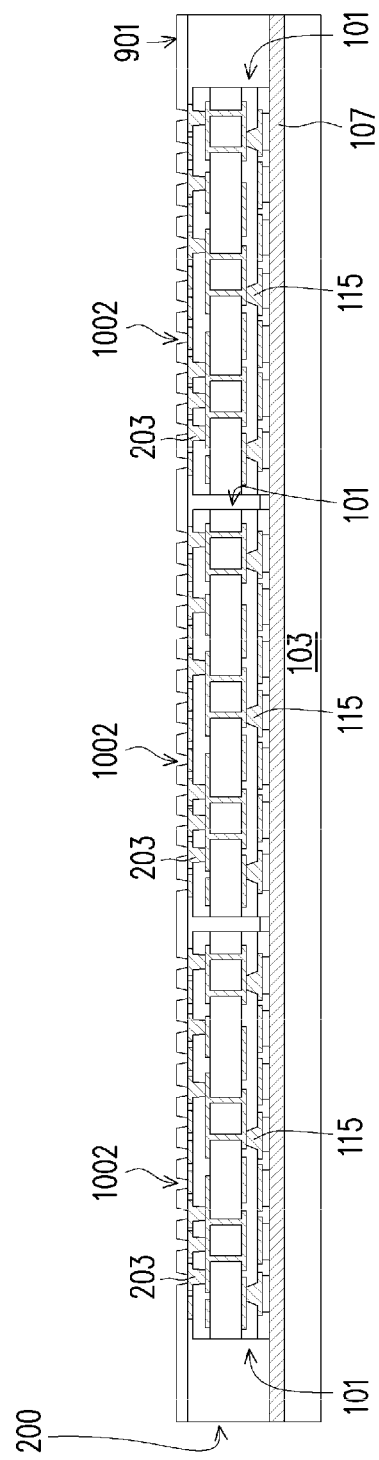

FIG. 10 illustrates a patterning of the first dielectric layer 901 using a suitable photolithographic mask and etching process to form openings 1002 in the first dielectric layer 901 in an intermediate step of forming a universal integrated fan out (InFO) component, according to an embodiment. Although, other suitable process or combination of processes may be used to pattern the first dielectric layer 901 of the series of dielectric layers. Openings 1002 are arranged in the first dielectric layer 901 to expose those portions of the external connectors 203 of the plurality of interconnect structures 101 already exposed in the planar surface of the reconstructed wafer 200. The openings 1002 allow for connections to be made to the underlying external connectors 203.

Figure 11:
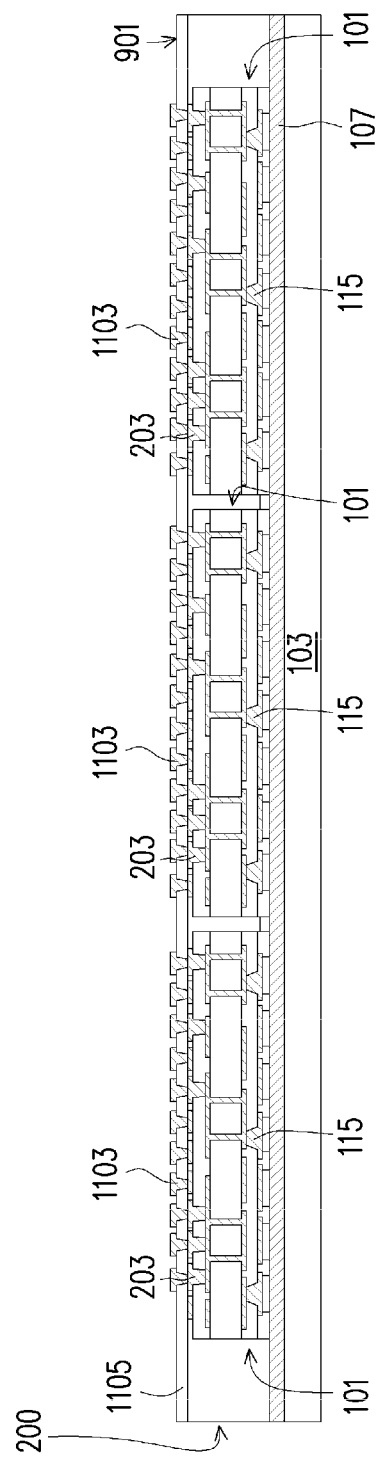

FIG. 11 illustrates forming a first universal redistribution layer (URDL) 1105 including a first conductive layer 1103 and the first dielectric layer 901. The first conductive layer 1103 may be formed as a series of conductive layers formed in the openings 1002 of the first dielectric layer 901, in an intermediate step of forming a universal integrated fan out (InFO) component, according to an embodiment. Once the first dielectric layer 901 of the series of dielectric layers has been formed and patterned, the first conductive layer 1103 may be formed over the first dielectric layer 901 and through the openings 1002 contacting the exposed portions of the external connectors 203 of the plurality of interconnect structures 101. In an embodiment, first conductive layer 1103 of the series of conductive layers may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where first conductive layer 1103 of the series of conductive layers is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may be used to form the first conductive layer 1103 of the series of conductive layers. Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Figure 12:
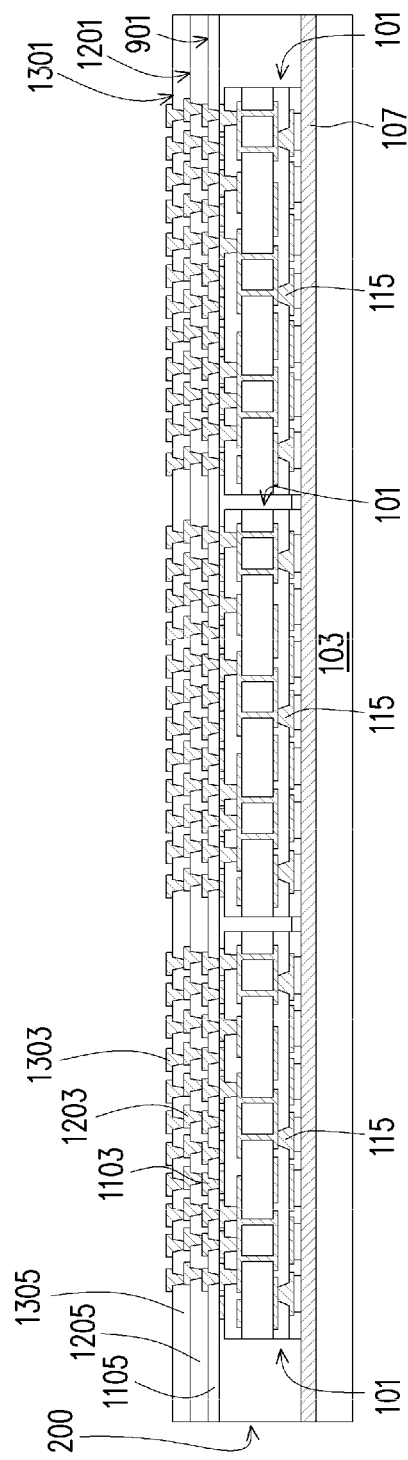

FIG. 12 illustrates forming a second universal redistribution layer (URDL) 1205, a third universal redistribution layer (URDL) 1305, in an intermediate step of forming a universal integrated fan out (InFO) component, according to an embodiment. The second universal redistribution layer (URDL) 1205 and the third universal redistribution layer (RDL) 1305 may be formed by repeating steps similar to forming the first dielectric layer 901 of the series of dielectric layers and similar to forming the first conductive layer 1103 of the series of conductive layers. These steps may be repeated as desired in order to electrically connect each of the series of conductive layers to an underlying one of the series of conductive layers, and may be repeated as often as desired until an uppermost one of the series of conductive layers (e.g., third conductive layer 1303) and an uppermost one of the series of dielectric layers (e.g., third dielectric layer 1301) have been formed. In an embodiment the deposition and patterning of the series of conductive layers and the series of dielectric layers may be continued until the redistribution layers have a desired number of layers, such as three or four layers, although any suitable number of individual layers may be utilized.

Figure 13:
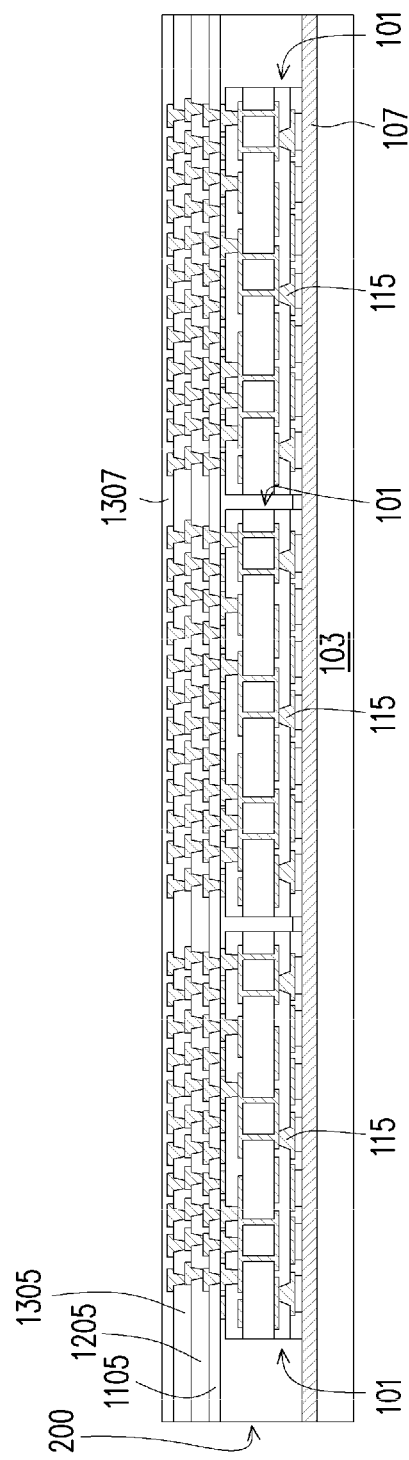

FIG. 13 illustrates a first passivation layer 1307 formed over the third universal redistribution layer (URDL) 1305 in order to provide protection and isolation for the third universal redistribution layer (URDL) 1305 and the other underlying structures. In an embodiment the first passivation layer 1307 may be polybenzoxazole (PBO), although any suitable material, such as polyimide or a polyimide derivative may also be utilized. The first passivation layer 1307 may be placed using, e.g., a spin-coating process to a thickness of between about 5 µm and about 25 µm, such as about 7 µm, although any suitable method and thickness may be used.

Figure 14:
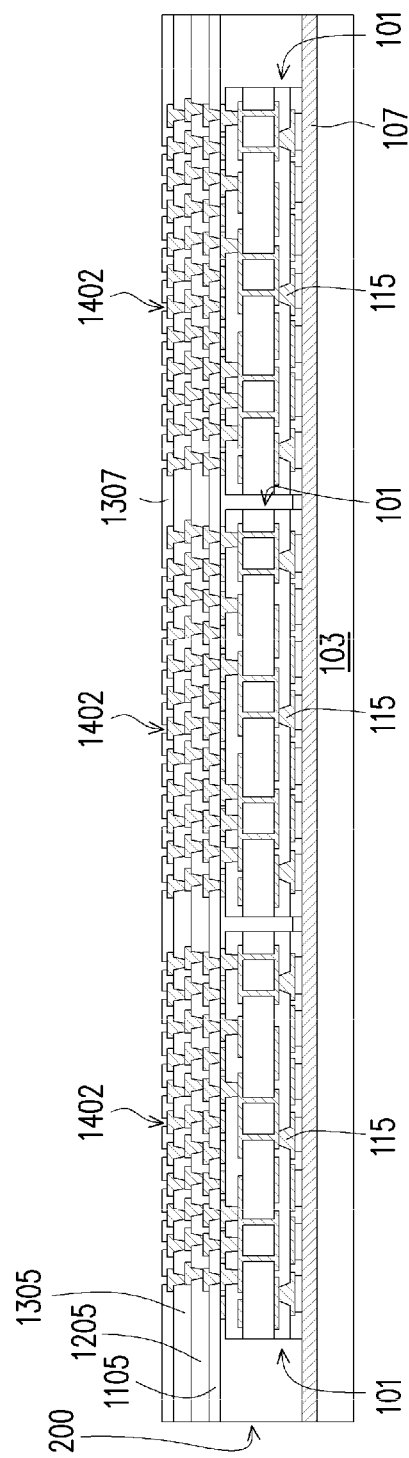

FIG. 14 illustrates a patterning of the first passivation layer 1307 of FIG. 13. Once the first passivation layer 1307 is in place, portions of contact areas of the underlying third conductive layer 1303 may be exposed through openings 1402 formed in the first passivation layer 1307. The openings 1402 may be formed by removing portions of the first passivation layer 1307 through a process such as photolithographic masking and etching, although any suitable removal process may alternatively be utilized.

Figure 15:
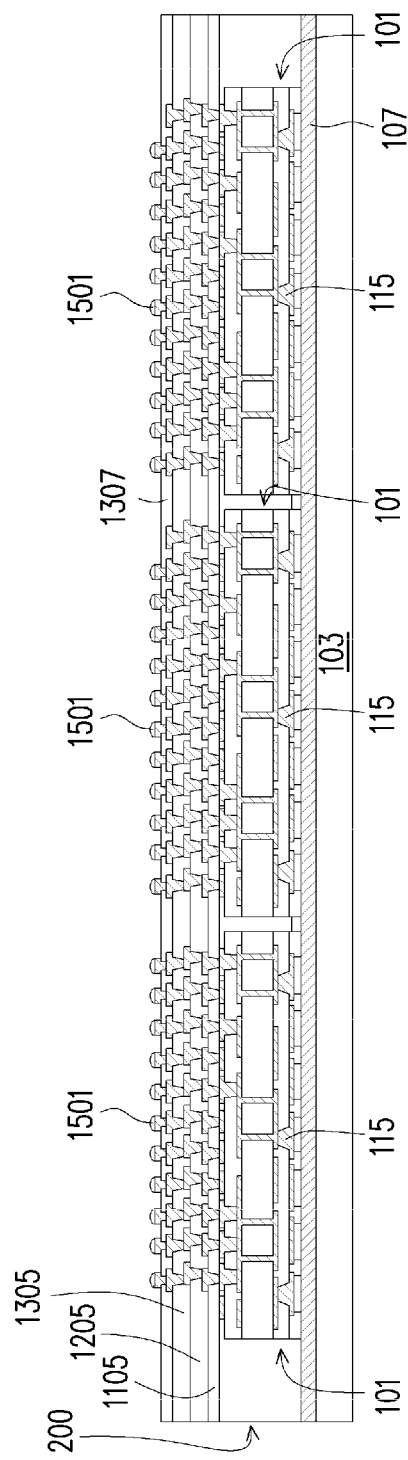

FIG. 15 illustrates forming device connections 1501 over the first passivation layer 1307 and in the openings 1402, shown in FIG. 14. Device connections 1501 may include conductive pillars and contact bumps. Once the portions of contact areas of the third conductive layer 1303 have been exposed, under bump metallizations (UBMs) of the device connections 1501 may be formed in contact with these exposed portions. In an embodiment the UBMs of the device connections 1501 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium tungsten/copper/nickel, or an arrangement of titanium/copper/nickel/gold, that are suitable for the formation of the UBMs. Any suitable materials or combination of different layers of material that may be used for the UBMs of the device connections 1501 are fully intended to be included within the scope of the current application.

Contact bumps of the device connections 1501 are formed in connection with the UBMs. In an embodiment, the contact bumps of the device connections 1501 may be microbumps, for example, and may comprise a material such as tin, or other suitable materials, such as silver or copper. In an embodiment in which the contact bumps of the device connections 1501 are tin solder bumps, the contact bumps of the device connections 1501 may be formed by initially forming a layer of tin through any suitable method such as evaporation, electroplating, printing, solder transfer, ball placement, etc., to a thickness of about 100 µm. Once a layer of tin has been formed on the structure, a reflow is performed in order to shape the material into the desired bump shapes.

Figure 16:
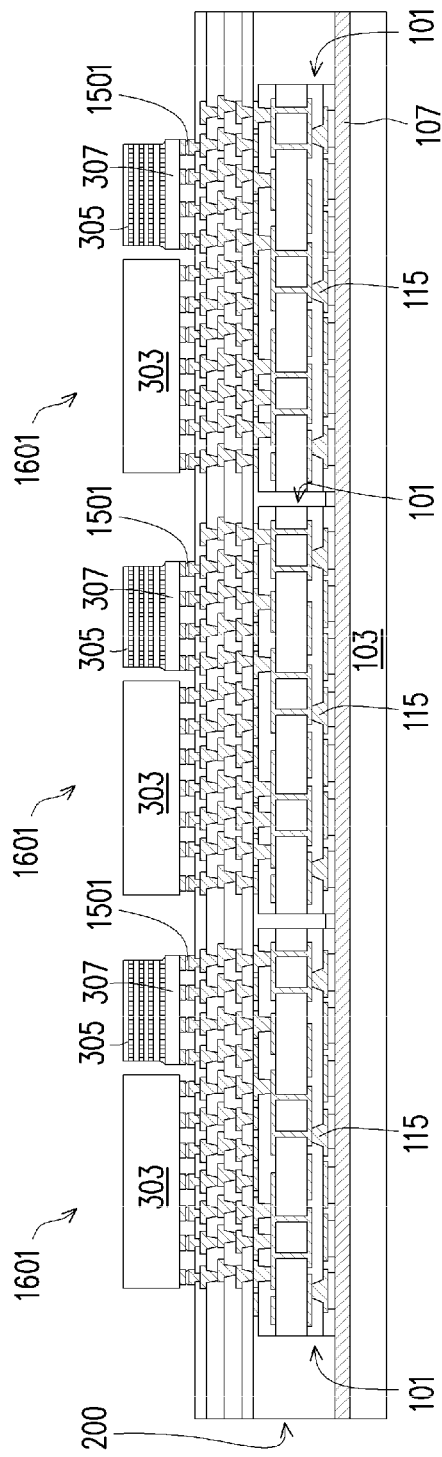

FIG. 16 illustrates bonding (e.g., flip-chip bonding) a plurality of discrete semiconductor components 1601 to the device connections 1501 illustrated in FIG. 15. In an embodiment, the plurality of discrete semiconductor components 1601 may include, for example, a processor xPU 303 and a memory cube 305 with an integrated memory controller 307. The plurality of discrete semiconductor components 1601 may be arranged, for example, by a pick and place machine (not shown), over the first passivation layer 1307 such that contact pads of the discrete semiconductor components 1601 (e.g., contact pads of the xPUs 303 and contact pads of Memory Cubes 305 with integrated memory controllers 307) are in contact with respective ones of the device connections 1501. Once aligned and in physical contact, a reflow may then be performed in order to reflow the material of the contact bumps of the device connections 1501 and bond the contact pads of plurality of discrete semiconductor components 1601 to the device connections 1501 formed in the first passivation layer 1307. However, any other suitable bonding method may alternatively be used. Although discrete semiconductor components are discussed, multi-device components may also be used, in place of or in combination, with the discrete semiconductor components.

Figure 17:
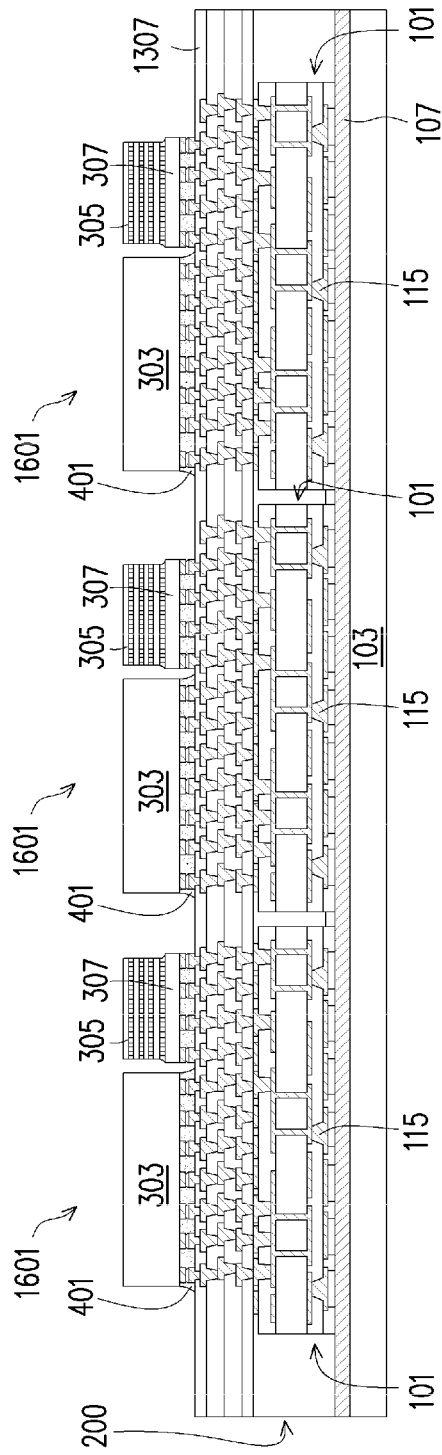

FIG. 17 illustrates an underfill process for supplying an underfill material 401 to openings between undersides of the plurality of discrete semiconductor components (e.g., xPU 303 and Memory Cube 305 with integrated memory controller 307) and the planar surface of the first passivation layer 1307. In some embodiments, an underfill material 401 may be formed between the discrete semiconductor components and the planar surface of the first passivation layer 1307, surrounding the bonded connections of the contacts of the discrete semiconductor components 1601 (e.g., contact pads of the xPUs 303 and contact pads of the Memory Cube 305 with integrated memory controller 307) and the device connections 1501 of the first passivation layer 1307. The underfill material 401 may be formed by a capillary underfill (CUF) flow process after the discrete semiconductor components 1601 have been attached. In another embodiment, the underfill material 401 may be provided by a suitable deposition process prior to the discrete semiconductor components 1601 being attached. Once the underfill material 401 has been provided, the discrete semiconductor components 1601 may be bonded to the planar surface of the first passivation layer 1307.

In other embodiments, the underfill may be provided by a Moldable Underfill (MUF) (not separately shown in FIG. 17) which allows for a single step to be performed in order to provide the underfill while encapsulating the discrete semiconductor components 1601 that are bonded to the planar surface of the first passivation layer 1307. The moldable underfill (MUF) may reduce stress and protect the bonds. Although CUF and MUF processes have been described for providing an underfill for the discrete semiconductor components 1601, any suitable material and any suitable process for providing an underfill may be used without departing from the spirit and scope of the embodiments described herein.

Figure 18:
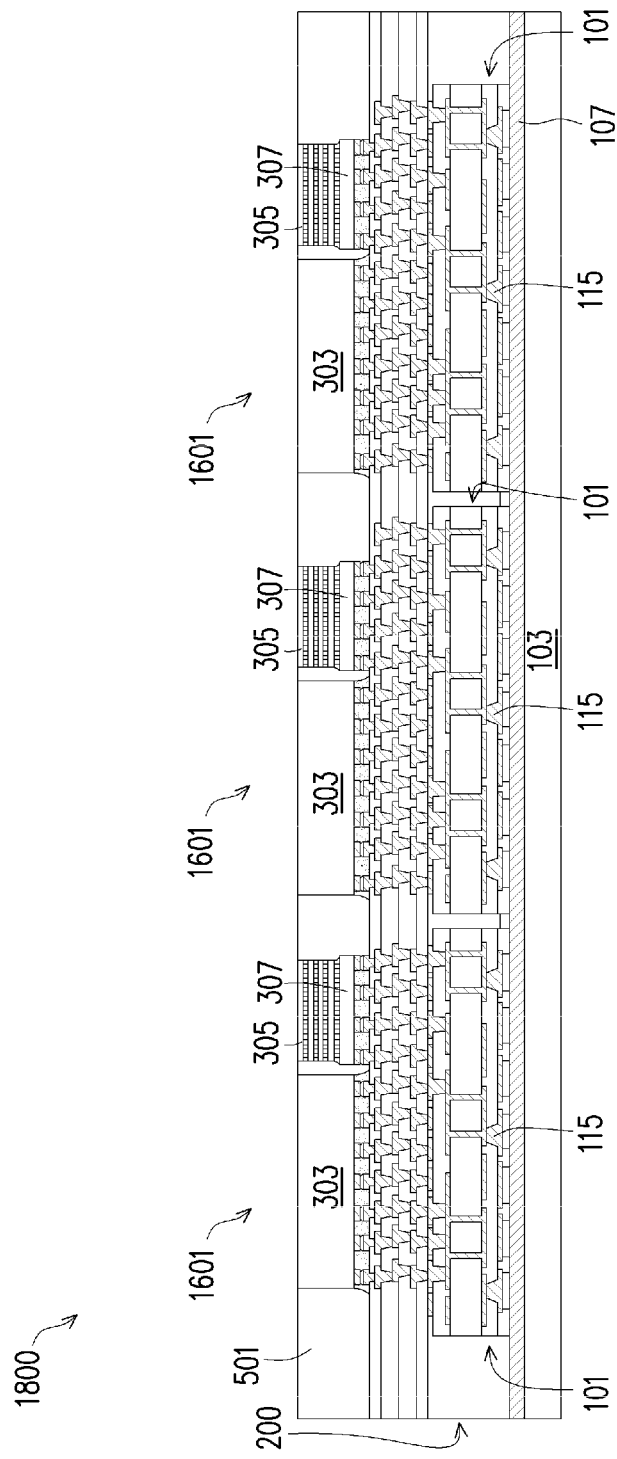

FIG. 18 illustrates an encapsulation of the discrete semiconductor components 1601 (e.g., xPU 303 and Memory Cube 305 with integrated memory controller 307) bonded to the planar surface of the first passivation layer 1307 to form another wafer level package 1800, according to some embodiments. The encapsulation may be performed in a molding device (not shown), which may comprise a top molding portion and a bottom molding portion separable from the top molding portion. When the top molding portion is lowered to be adjacent to the bottom molding portion, a molding cavity may be formed.

During the encapsulation process the top molding portion may be placed adjacent to the bottom molding portion, thereby enclosing the intermediate product of FIG. 17 within the molding cavity. Once enclosed, the top molding portion and the bottom molding portion may form an airtight seal in order to control the influx and outflux of gasses from the molding cavity. Once sealed, the encapsulant 501 may be placed within the molding cavity. The encapsulant 501 may be a molding compound resin such as polyimide, PPS, PEEK, PES, a heat resistant crystal resin, combinations of these, or the like. The encapsulant 501 may be placed within the molding cavity prior to the alignment of the top molding portion and the bottom molding portion, or else may be injected into the molding cavity through an injection port.

In an embodiment, the encapsulant 501 may also serve as a molded underfill (MUF) material for filling gaps between the plurality of the packaged semiconductor devices 301 and the planar surface of the reconstructed wafer 200. However, any suitable MUF encapsulant materials may be used.

Once the encapsulant 501 has been placed into the molding cavity, the encapsulant 501 may be cured in order to harden the encapsulant 501 for optimum protection. While the exact curing process is dependent at least in part on the particular material chosen for the encapsulant 501, in an embodiment in which molding compound is chosen as the encapsulant 501, the curing could occur through a process such as heating the encapsulant 501 to between about 100° C. and about 130° C., such as about 125° C. for about 60 sec to about 3000 sec, such as about 600 sec. Additionally, initiators and/or catalysts may be included within the encapsulant 501 to better control the curing process.

However, as one having ordinary skill in the art will recognize, the curing process described above is merely an embodiment of the curing process and is not meant to limit the other embodiments described herein. Other curing processes, such as irradiation or even allowing the encapsulant 501 to harden at ambient temperature, may alternatively be used. Any suitable curing process may be used, and all such processes are fully intended to be included within the scope of the embodiments discussed herein.

FIG. 18 also illustrates a thinning of the encapsulant 501 in order to provide a thin package and/or in order to expose one or more surfaces of the discrete semiconductor devices 1601 for further processing. The thinning may be performed, e.g., using a mechanical grinding or chemical mechanical polishing (CMP) process whereby chemical etchants and abrasives are utilized to react and grind away the encapsulant 501 until a desired thinning of the encapsulant 501 and/or backsides of the discrete semiconductor devices 1601 (e.g., xPU 303) have been exposed for further processing. As such, one or more of the backsides of the plurality of discrete semiconductor devices 1601 (e.g., xPU 303) may have a planar surface that is also planar with the encapsulant 501.

However, while the CMP process described above is presented as one illustrative embodiment, it is not intended to be limiting to the embodiments. Any other suitable removal process may alternatively be used to thin the encapsulant 501 and/or one or more of the backsides of the plurality of discrete semiconductor devices 1601 (e.g., xPU 303). For example, a series of chemical etches may be utilized. This process and any other suitable process may alternatively be utilized to thin the encapsulant 501 and the one or more of the plurality of discrete semiconductor devices 1601 (e.g., xPU 303) and all such processes are fully intended to be included within the scope of the embodiments.

Figure 19:
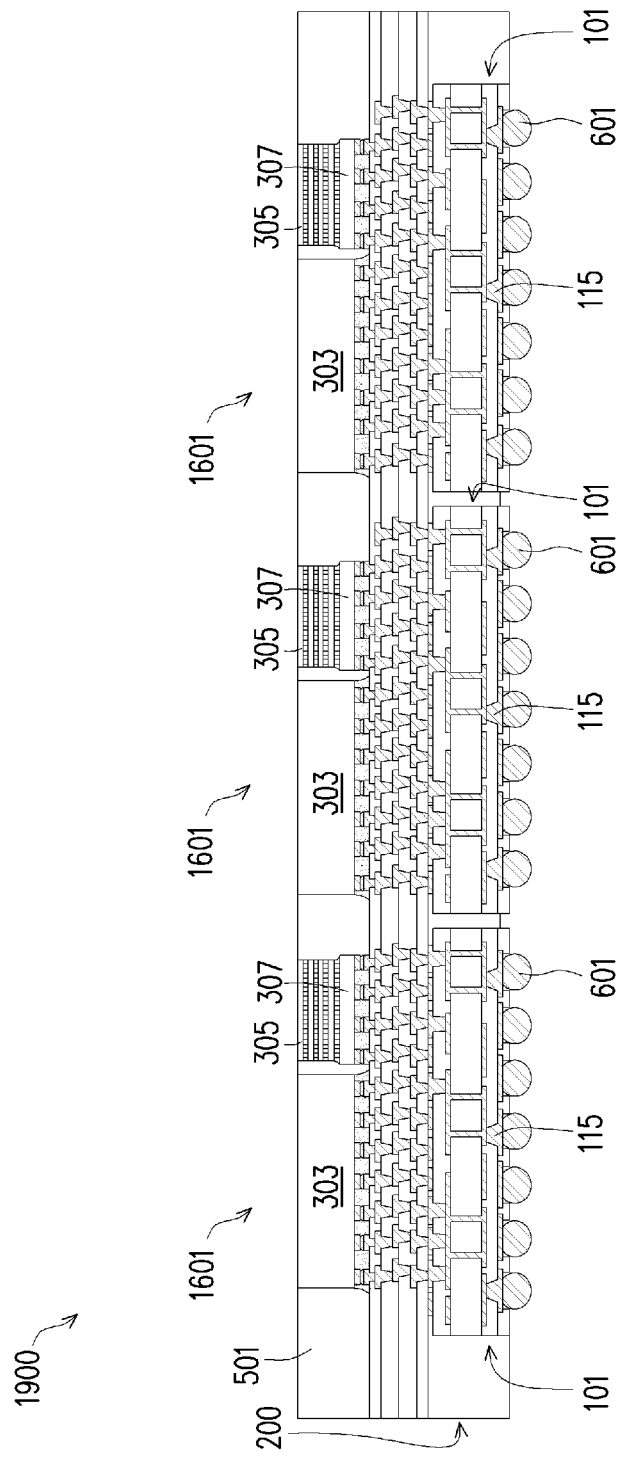
FIG. 19 illustrates a de-bonding of a carrier substrate and forming external contacts on the multi-chip module (MCM) including the single universal interconnect structure, according to some embodiments.

FIG. 19 illustrates a de-bonding of the carrier substrate 103 from the another wafer level package 1800 and forming of external contacts 601 of the multi-die InFO package 1900, according to some embodiments. In some embodiments, in order to de-bond the carrier substrate 103, a handling wafer (not shown) may be adhered to the planarized, thinned backside of the encapsulation material 501. In other embodiments, a wafer handling ring (not shown) and ultraviolet tape (not shown) may be used to provide support and stability for the encapsulated plurality of discrete semiconductor devices 1601 during and after the de-bonding process. In an embodiment the planarized, thinned backside of the encapsulation material 501 is attached to the ring structure using, e.g., an ultraviolet tape (not shown), although any other suitable adhesive or attachment may alternatively be used.

Once the handling wafer or alternatively the tape of the ring structure (not shown) has been appropriately attached to the thinned, backside of the encapsulated plurality of discrete semiconductor devices 1601, the carrier substrate 103 may be de-bonded from the interconnect structures 101 and surfaces of the reconstructed wafer 200 using, e.g., a thermal process to alter the adhesive properties of the adhesive film 107. For example, an energy source such as an ultraviolet (UV) laser, a carbon dioxide ($CO_2$) laser, or an infrared (IR) laser, may be used to irradiate and heat the adhesive of the tape until at least some of the adhesive properties of the tape are lost. Once performed, the carrier substrate 103 and any associated adhesive layer may be physically separated and removed from the surfaces of the reconstructed wafer 200 including the plurality of interconnect structures 101 and the first encapsulant 201.

Once de-bonded from the carrier substrate 103, a plurality of external connections 601 may be formed on exposed portions of the redistribution layer conductive structures 115 of the embedded interconnect substrate 101. These external connections 601 provide external connection points for electrically connecting the multi-die InFO package 1900 to external devices. In an embodiment, the external connections 601 may be, for example, a contact bump, although any suitable connection may be utilized. In an embodiment in which the external connections 601 are contact bumps, external connections 601 may comprise a material such as tin, or other suitable materials, such as silver, lead-free tin, or copper. In an embodiment in which the external connections 601 is a tin solder bump, the external connections 601 may be formed by initially forming a layer of tin through such commonly used methods such as evaporation, electroplating, printing, solder transfer, ball placement, etc, to a thickness of, e.g., about 100 μm. Once a layer of tin has been formed on the structure, a reflow may be performed in order to shape the material into the desired bump shape. In some embodiments, the external connections 601 may be solder bumps/balls; in other embodiments, the external connections 601 include a conductive pillar. However, any suitable material and appropriate connection may be used to form external connections 601.

Features of the embodiments discussed herein, for example, the reconstructed wafer 200 being formed from the intermediate structure 100 of the plurality of interconnect structures 101 or from an un-singulated wafer, integrated fan out (InFO) technologies, and solder bonding and/or low temp Cu-to-Cu bonding used during build up, allow for super large package component sizes to be achieved. These super large package sizes (e.g., >70 mm by 70 mm) are utilized to support high performance computing (HPC) applications used in advanced networking and server applications including applications such as network services that rely on artificial intelligence (AI) dependent applications.

By forming the package components as described herein, the package components can be bonded to further devices (e.g., printed circuit boards) without being further singulated. Embodiments of super large package components disclosed herein can support the enormous demands for high data rates, large bandwidths and low latency that are placed on advanced network components and servers while providing excellent electrical performance (e.g., >1 TbE) with greater component level and board level reliability. For example, component level and board level reliability issues are greatly reduced due to component level and board level testing during manufacturing. This testing ensures that only components (e.g., semi-finished substrate packages) that are known to be good are used during packaging which greatly increases the reliability and performance of the components and the interconnects. Greater board level reliability is further achieved by using solder bonding and/or low temp Cu-to-Cu bonding which allows for relatively lower temperatures to be used during build up, as discussed above. Furthermore, super large package components may be formed to have an equivalent coefficient of thermal expansion (CTE) that is close to or approximate that of printed circuit board (PCB) which minimizes stress between materials during processing, as also discussed above, which may further increase the board level reliability. Furthermore, the process for forming the super large package components, according to the embodiments disclosed herein, being integrated in wafer form allows for a much more simplified process flow.

In accordance with an embodiment, a method of forming a semiconductor device includes arranging a plurality of interconnect structures on a carrier substrate, encapsulating the plurality of interconnect structures in a first encapsulant; electrically coupling at least one semiconductor component of each of a plurality of semiconductor dies to one or more of the plurality of interconnect structures; encasing the plurality of semiconductor dies and portions of the first encapsulant in a second encapsulant; removing the carrier substrate from the plurality of interconnect structures; and bonding a plurality of external contacts to first sides of the plurality of interconnect structures. In an embodiment, the method also includes exposing a plurality of first contact areas on second sides of each of the plurality of interconnect structures, the second sides of the plurality of interconnect structures being opposite the first sides of the plurality of interconnect structures. In an embodiment, the electrically coupling the at least one semiconductor component of each of the plurality of semiconductor dies to one or more of the plurality of interconnect structures includes placing at least one semiconductor die of the plurality of semiconductor dies over an adjacent pair of interconnect structures of the plurality of interconnect structures. In an embodiment, the exposing the plurality of first contact areas includes performing a chemical mechanical polishing process. In another embodiment, the electrically coupling the at least one semiconductor component of each of the plurality of semiconductor dies to one or more of the plurality of interconnect structures includes placing each of the semiconductor dies over a respective one of the interconnect structures. In an embodiment, the electrically coupling the at least one semiconductor component of each of the plurality of semiconductor dies to one or more of the plurality of interconnect structures includes placing a memory cube on a first one of the interconnect structures. In an embodiment, the encasing the plurality of semiconductor dies in the second encapsulant includes encasing the memory cube and an adjacent processor for controlling the memory cube in the second encapsulant with the second encapsulant being in contact with and between sidewalls of the memory cube and the processor. In an embodiment, the encapsulating the plurality of interconnect structures in the first encapsulant includes forming the first encapsulant in contact with and between sidewalls of adjacent interconnect structures and forming the first encapsulant between a sidewall of a wafer level interconnect structure and a perimeter of the carrier substrate.

In accordance with an embodiment, a method of forming a semiconductor device, includes arranging an interconnect structure on a carrier substrate; embedding the interconnect structure in a first encapsulant; forming a series of redistribution layers over the interconnect structure, wherein each of the redistribution layers includes a plurality of conductive layers embedded in a dielectric layer; bonding a plurality of semiconductor dies to the series of redistribution layers, wherein at least one of the plurality of semiconductor dies is electrically connected through the series of redistribution layers to the interconnect structure; and encasing the plurality of semiconductor dies and portions of a surface of the first encapsulant that is opposite the carrier substrate in a second encapsulant. In an embodiment, the bonding a plurality of semiconductor dies includes direct metal-to-metal bonding. In another embodiment, the bonding a plurality of semiconductor dies includes solder bonding. According to an embodiment, the embedding the interconnect structure in the first encapsulant includes forming the first encapsulant in contact with and between sidewalls of the interconnect structure and a perimeter of the carrier substrate. In an embodiment, the forming the series of redistribution layers over the interconnect structure includes forming the series of redistribution layers over and in contact with the first encapsulant in an area between the sidewalls of the interconnect structure and the perimeter of the carrier substrate.

In accordance with an embodiment, a semiconductor device, includes a plurality of semi-finished substrates embedded in a first encapsulant; a plurality of semiconductor dies electrically connected to one or more of the plurality of semi-finished substrates; a second encapsulant encasing the plurality of semiconductor dies over the first encapsulant; and a plurality of external contacts bonded to the plurality of semi-finished substrates, the plurality of external contacts being electrically coupled to at least one semiconductor component of the plurality of semiconductor dies. In an embodiment, the first encapsulant is in contact with and separates sidewalls of adjacent semi-finished substrates. In an embodiment, a portion of the first encapsulant is in contact with a sidewall of a first semi-finished substrate and extends in a direction substantially perpendicular from the sidewall of the first semi-finished substrate to an outer side surface of the semiconductor device. According to an embodiment, the second encapsulant is in contact with and spaces apart sidewalls of a memory cube and an adjacent processor for controlling the memory cube. In accordance with an embodiment, the semiconductor device also includes a series of redistribution layers disposed over the plurality of semi-finished substrates, each of the redistribution layers including a conductive layer embedded in a dielectric layer. In an embodiment, bonds of the plurality of external contacts are direct metal-to-metal bonds. In another embodiment, the semiconductor device also includes a printed circuit board bonded to the plurality of external contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
    a wafer comprising a plurality of interconnect structures embedded in a first encapsulant;
    a plurality of semiconductor dies electrically connected to the plurality of interconnect structures, wherein each semiconductor die of the plurality of semiconductor dies is disposed at a same level as another semiconductor die of the plurality of semiconductor dies, wherein the first encapsulant is not overlapped by any semiconductor die of the plurality of semiconductor dies;

a second encapsulant encasing the plurality of semiconductor dies over the first encapsulant; and a plurality of external contacts on the plurality of interconnect structures, the plurality of external contacts being electrically coupled to a semiconductor component of the plurality of semiconductor dies.

2. The semiconductor device of claim 1, wherein the first encapsulant is in contact with and separates sidewalls of adjacent ones of the plurality of interconnect structures, and wherein a material of the first encapsulant is different from a material of the second encapsulant.

3. The semiconductor device of claim 1, wherein the first encapsulant is in contact with a sidewall of a first interconnect structure of the plurality of interconnect structures, and wherein the first encapsulant extends in a direction substantially perpendicular from the sidewall of the first interconnect structure to an outer side surface of the semiconductor device.

4. The semiconductor device of claim 1, wherein the second encapsulant is in contact with a sidewall of a memory cube and a sidewall of a processor adjacent to the memory cube, wherein the processor controls the memory cube.

5. The semiconductor device of claim 1, further comprising:
a plurality of redistribution layers disposed over the plurality of interconnect structures, wherein each of the plurality of redistribution layers includes a conductive layer embedded in a dielectric layer.

6. The semiconductor device of claim 1, wherein the plurality of external contacts are bonded to the plurality of interconnect structures by direct metal-to-metal bonds.

7. The semiconductor device of claim 1, further comprising a printed circuit board bonded to the plurality of external contacts.

8. A semiconductor device, comprising:
a first interconnect structure and a second interconnect structure embedded in a first encapsulant, each of the first and second interconnect structures comprising:
a first substrate; and
one or more through-substrate vias (TSVs) extending through the first substrate;
a first semiconductor die overlapping the first interconnect structure and the second interconnect structure, wherein the first semiconductor die is electrically connected to the first interconnect structure and the second interconnect structure through a first plurality of external contacts;
an underfill disposed between the first semiconductor die and the first interconnect structure and the second interconnect structure; and
a second plurality of external contacts on an opposite side of the first interconnect structure and the second interconnect structure as the first plurality of external contacts, the second plurality of external contacts being electrically coupled to the first semiconductor die through one or more TSVs of the first interconnect structure and one or more TSVs of the second interconnect structure.

9. The semiconductor device of claim 8, wherein the first substrate comprises a glass interposer or a ceramic substrate.

10. The semiconductor device of claim 8, wherein the first encapsulant is disposed between the first interconnect structure and the second interconnect structure.

11. The semiconductor device of claim 8, further comprising a second encapsulant over the first encapsulant, wherein the second encapsulant surrounds the first semiconductor die.

12. The semiconductor device of claim 11, wherein a first material of the second encapsulant and a second material of the underfill are the same.

13. The semiconductor device of claim 8, wherein the first plurality of external contacts comprise copper pillars or copper posts.

14. The semiconductor device of claim 8, wherein each of the first interconnect structure and the second interconnect structure further comprises a redistribution layer comprising:
a dielectric layer; and
a conductive layer embedded in the dielectric layer.

15. A semiconductor device, comprising:
an interconnect structure embedded in a first encapsulant;
a plurality of semiconductor dies electrically connected to the interconnect structure through a first plurality of contacts;
a second encapsulant over the first encapsulant and the interconnect structure, wherein the second encapsulant surrounds each of the plurality of semiconductor dies, wherein the second encapsulant is in contact with and separates sidewalls of adjacent ones of the plurality of semiconductor dies;
a second plurality of contacts on an opposite side of the interconnect structure as the first plurality of contacts, wherein the second plurality of contacts electrically connect the interconnect structure to a first device; and
one or more through-substrate vias (TSVs) extending through the interconnect structure to electrically connect the first plurality of contacts to the second plurality of contacts.

16. The semiconductor device of claim 15, wherein each of the plurality of semiconductor dies comprises a memory cube and a processor controlling the memory cube.

17. The semiconductor device of claim 15, wherein the interconnect structure and a perimeter of the first encapsulant is circular in shape.

18. The semiconductor device of claim 17, wherein a first diameter of the first encapsulant is larger than a second diameter of the interconnect structure.

19. The semiconductor device of claim 18, wherein the first diameter of the first encapsulant is in a range from about 300 mm to about 460 mm.

20. The semiconductor device of claim 15, wherein the first device is a printed circuit board.

* * * * *